Figure 1:
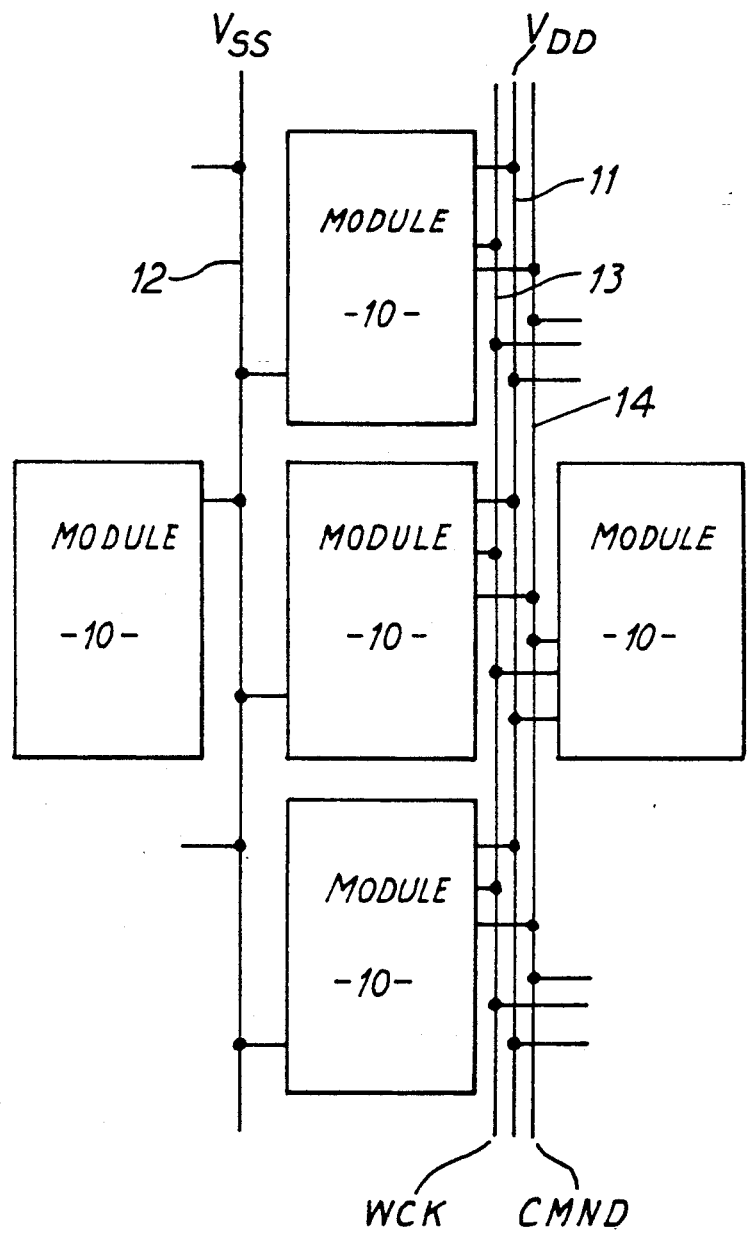

United States Patent [19]

Brent et al.

[11] Patent Number: 5,072,424
[45] Date of Patent: Dec. 10, 1991

[54] WAFER-SCALE INTEGRATED CIRCUIT MEMORY

[75] Inventors: Michael Brent, London; Neal MacDonald, Cambridge, both of England

[73] Assignee: Anamartic Limited, Cambridge, England

[21] Appl. No.: 26,910
[22] PCT Filed: Jul. 11, 1986
[86] PCT No.: PCT/GB86/00400
   § 371 Date: Mar. 12, 1987
   § 102(e) Date: Mar. 12, 1987
[87] PCT Pub. No.: WO87/00674
   PCT Pub. Date: Jan. 29, 1987

[30] Foreign Application Priority Data

Jul. 12, 1985 [GB] United Kingdom ............. 8517699
Oct. 15, 1985 [GB] United Kingdom ............. 8525324

[51] Int. Cl.[5] .................... G11C 7/00; G11C 8/00
[52] U.S. Cl. ................. 365/189.01; 365/230.03; 365/236; 365/239
[58] Field of Search ............. 365/189, 230, 222, 236, 365/239, 240, 189.01, 189.12, 230.03, 230.05, 230.09, 221

[56] References Cited

U.S. PATENT DOCUMENTS

| | | | |
|---|---|---|---|
| 3,913,072 | 10/1975 | Catt | 365/200 |
| 4,316,264 | 2/1982 | Harari | 365/154 |
| 4,493,055 | 1/1985 | Osman | 365/78 |
| 4,581,718 | 4/1986 | Oishi et al. | 365/222 |
| 4,646,270 | 2/1987 | Vose | 365/236 |
| 4,706,216 | 11/1987 | Carter | 365/94 |

FOREIGN PATENT DOCUMENTS 2128382 4/1984 United Kingdom ............. 365/133

OTHER PUBLICATIONS

IBM Technical Disclosure Bulletin, vol. 13, No. 8, Jan. 1971 (New York, US), R. Veit: "Increased packing density of monolithic storages", p. 2436.
Patents Abstracts of Japan, vol. 2, No. 156 (10217) (E-78), 26 Dec. 1978, and JP, A, 53-126229 (Nippon Denki K.K.), 11 Apr. 1978.

*Primary Examiner*—Joseph A. Popek
*Attorney, Agent, or Firm*—Robert F. O'Connell

[57] ABSTRACT

A wafer scale integrated circuit comprises a few hundred modules (10) which can be connected into a long chain by commands sent to the modules along a transmit path set up by way of module inputs (XINN, XINE, XINS, XINW) from neighboring modules and outputs thereto (XOUTN, XOUTE, XOUTS, XOUTW), only one of which is enabled by one of four selection signals (SELN, SELE, SELS, SELW) acting both on transmit path logic (20) and on receive path logic (21) in a return path. Each module includes configuration logic (22) which decodes commands providing the selection signals (SELN, etc), a READ signal and a WRITE signal. The configuration logic (22) is addressed when a bit is presented thereto by the transmit path simultaneously with assertion of a signal (CMND) which is supplied globally to all modules. The address configuration logic clocks the bit along a shift register and the selected command is determined by the position of the bit at the time that the global signal (CMND) is terminated. Each module includes am memory unit (23) including a free running address counter. When the WRITE command appears a data stream on the transmit path is read into the memory. When READ appears, the contents of the memory are read out onto the return path. Memory refresh occurs conventionally under control of the free-running address counter. In order to avoid heavy current in any of the power distribution conductors on the wafer, the count cycles of the free-running address counters are staggered.

12 Claims, 15 Drawing Sheets

FIG.7 XMIT PATH LOGIC 20

WAFER-SCALE INTEGRATED CIRCUIT MEMORY

Various proposals have been made for wafer scale integrated circuit (WSI) memories. These include bus-organized devices in which the individual memory modules are connected to address, data and control buses on the wafer, just as discrete integrated circuit memory modules are connected to buses on a printed circuit board. A disadvantage of such devices is the large number of lines in the buses. For example an article "A 1-Mbit Full-/Wafer MOS RAM", Egawa et al, IEEE Journal of Solid-State Circuits, Vol SC-15 No 4, August 1980 pp 677–686 describes a device with no less than 60 lines (including power lines) interfaced to the wafer and routed to 46 memory modules on half a wafer. With such dense patterns of connecting lines there is a significant risk of bus faults. Moreover it is necessary to provide spare modules for replacing defective modules.

In other proposals the modules on a wafer include control or configuration logic which can be commanded to grow the modules into a long chain (often called a spiral because of a typical growth pattern) which avoids defective modules. In such devices, a simple bus structure is essential; otherwise the configuration logic has to switch too many connections. In proposals of this kind, e.g. GB 1 377 859, shift registers have been contemplated as the memory devices. The chain of modules becomes a very large shift register. A disadvantage of such an arrangement is the long average latency in accessing data. Another disadvantage is that any fault in a shift register corrupts all data. For this reason it is already known in large scale integrated circuits to use a random-access memory (RAM) addressed by a free-running address counter as a replacement for a large shift register. RAM faults only affect data locally.

The object of the present invention is to provide a WSI memory architecture which enables a simple bus structure to be combined with relatively small latency of access.

According to the present invention there is provided a WSI memory comprising a plurlaity of memory modules on a wafer, each module including a RAM and a free-running address counter addressing the RAM, means for addressing read and write commands to the memory modules individually and at least one data path chained through a series of the modules, each module being responsive to a read command addressed thereto to cause the contents of the RAM to be read out on to the or a data path as the address counter cycles through its counts and each module being responsive to a write command addressed thereto to write into the RAM data supplied on the or a data path as the address counter cycles through its counts.

Although a single data path could be used for read and write data, it is preferred to provide a first data path for transmitting write data to modules and a second data path for receiving read data from modules.

It is necessary to be able to send commands to the modules individually. As well as the read and write commands, there may be commands for controlling the growth of the chain. Use may be made of any of various techniques which have been suggested for addressing commands to individual modules. Each module may be given its own address and commands can include address field, whereby associative addressing is employed. Another proposal (see again GB 1 377 859) utilises an address number in each command. As the command passes from module to module, the address number is decremented or incremented until a predetermined number is reached (e.g. zero), whereupon the command is executed by the module at which this event occurs.

Another idea proposed in GB 1 377 859 is to issue a global command to all modules. Such a command is issued by way of a global line, that is to say a line running to all modules in parallel, in contrast to lines chained through the modules. Other global lines can include power and clock lines. A module performs a specific function when it receives the global command and the module is concurrently receiving a specific state signal from an adjacent module. In GB 1 377 859 this is proposed as part of the mechanism for growing the chain of modules.

The preferred command mechanism for implementing commands is as follows. Each module includes a shift register arrangement responsive to clock pulses provided to all modules in the chain, all modules are connected to a global command line, and each module is operative to execute a selected command on receipt of a command signal on the global command line when a token is then present in its shift register arrangement, the command selection being at least partially determined by the position of the token within the shift register arrangement.

The token could consist of more than one bit and the selection of a command could then be determined in part by the location of the token and in part by a decode of the token itself. However, it is preferred to use a single bit token (such as a "1" in a stream of zeroes) and to make command selection dependent solely upon the location of the token when the global command signal is received.

The token is preferably sent by way of the data path which carries write data for the modules. This data path includes part of the control logic of each module and this part will be called the serial logic. The control logic will additionally include sidechain logic, that is to say logic which is branched off the path through which the modules are chained. Any defect in the serial logic of a module will break the chain and render the apparatus inoperable and there is a high premium on keeping the serial logic as simple as possible. As is well known, a significant problem in WSI is avoidance of faulty modules. It is advantageous to be able to utilise the serial logic of a faulty module (provided the serial logic is functioning) even although the RAM of the module is not used, and may even be disabled, because it is faulty. The use of good serial logic of otherwise faulty modules makes it possible to grow chains more efficiency and include within the chain a higher proportion of non-faulty modules than if the chain excludes a module which is in any way faulty, (which is the approach adopted in GB 1 377 859).

It is preferred therefore that the shift register arrangement is mainly or wholly in the side-chain logic. The serial logic includes very few, preferably only one, bit buffer stages. Two global command signals are required. The first causes a token to be seized at a module and to be clocked down its side-chain shift register arrangement. The second causes the module in question to execute a command in dependence upon the position which the token has reached along the side-chain shift register arrangement. The first and second global command signals could be provided by way of separate global lines but it is much preferred to use a single global line and to provide both signals on this line. Again the preferred technique is to represent one signal by asserting a particular logic level and to represent the second signal by terminating this assertion. In the embodiment to be described below the first signal is given when CMND goes true, the second when CMND reverts to false.

Another problem encountered in WSI devices is dissipation of heat and instantaneous current demand, particularly if dynamic RAM requiring cyclic refresh operations is employed. It has already been proposed in the aforementioned article by Egawa et al to refresh memory modules in staggered groups so that no more than two modules on the same power line are refreshed simultaneously. This is achieved by appropriately arranging the refresh commands provided from off the wafer, via the control and address buses.

A development of the present invention can provide a much simpler solution to the problem.

According to this development, each module incorporates its own refresh circuitry, controlled by the free running address counter and the free running address counters have staggered count cycles so as to even out power supply demands on the power supply lines.

It is preferred to arrange that no more than a specified small number of modules served by the same power supply conductor on the wafer refresh simultaneously. The small number is desirably one as this will allow the conductor tracks to be reduced to the minimum possible width, thereby saving layout area on the wafer.

Although the staggering of the count cycles can be built into the hardware (each module could patch its address counter to a different initial value at power-on or other global reset) this would not merely increase the wafer complexity; it requires the modules to be individually customized. It is greatly preferred to use identical modules capable of responding to an addressed address counter reset command to reset the counter at the time of that command. The modules can then be commanded to set up any desired pattern of refresh cycles. These may be assigned according to a fixed schedule or may be dynamically assigned so as to improve means access times, as explained below.

In turning to description of a preferred embodiment it is noted that the present application claims priority from our application No. 8517699, hereinafter referred to as "the priority application".

Figure 2:
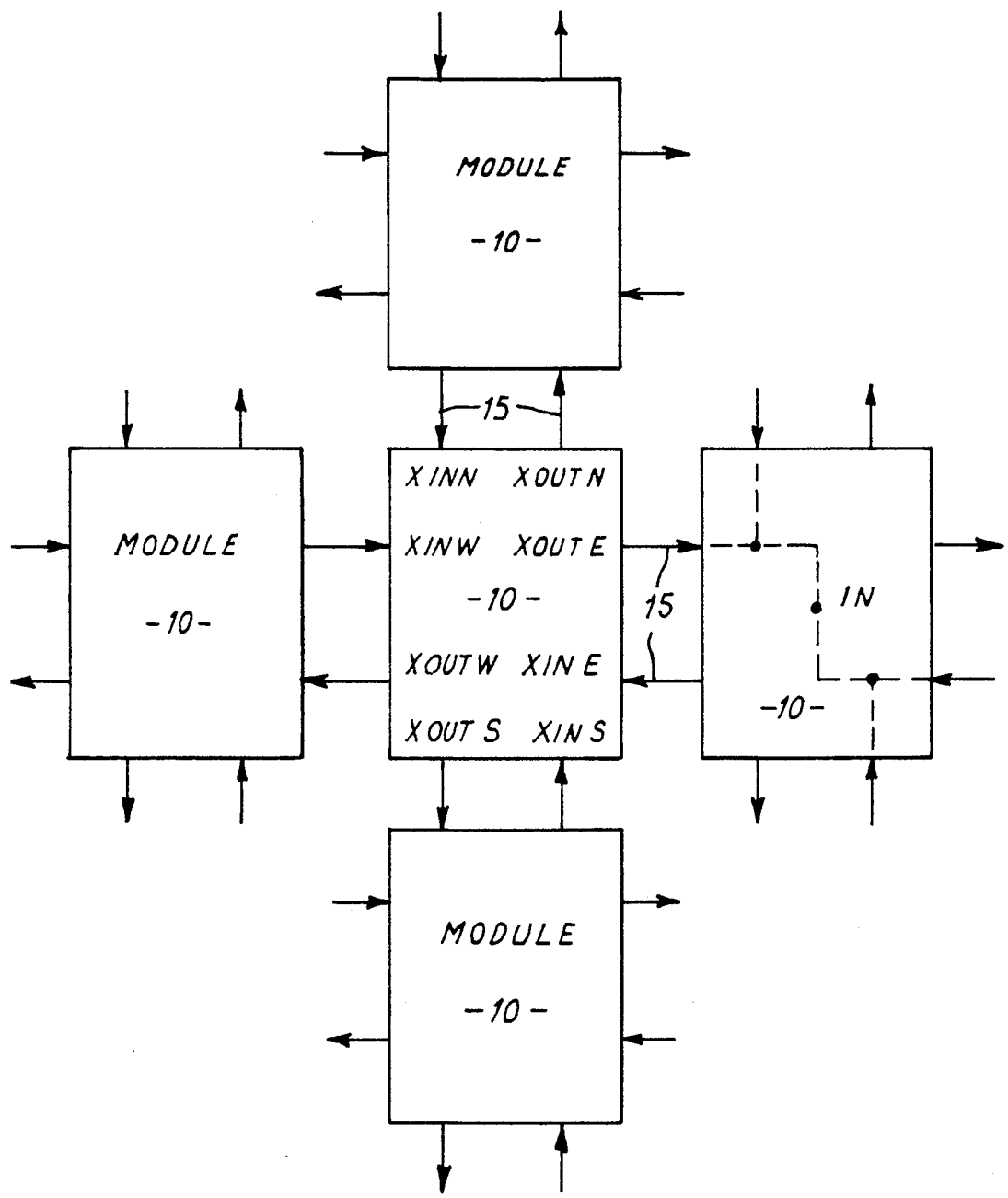
Figure 3:
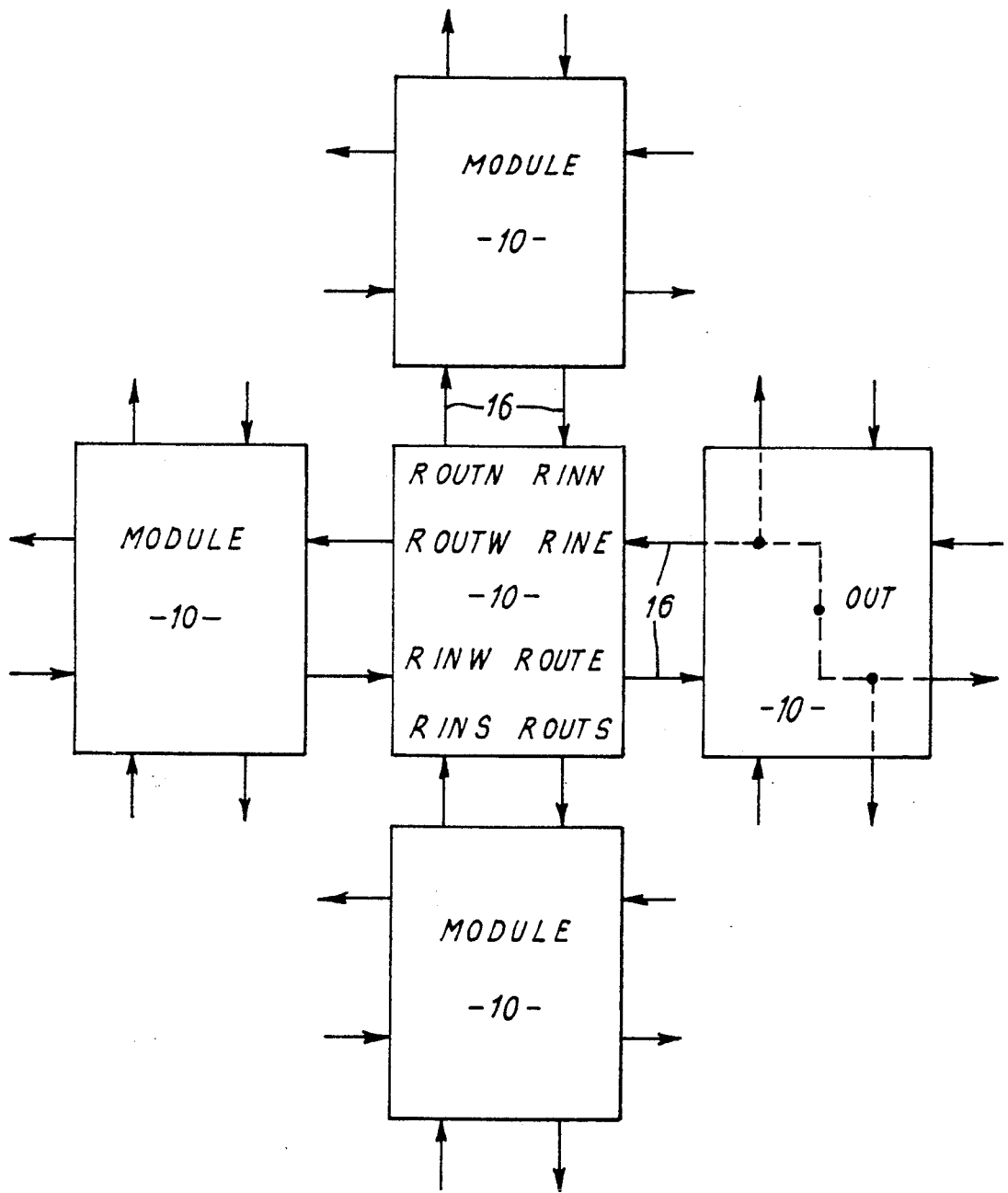
Figure 4:
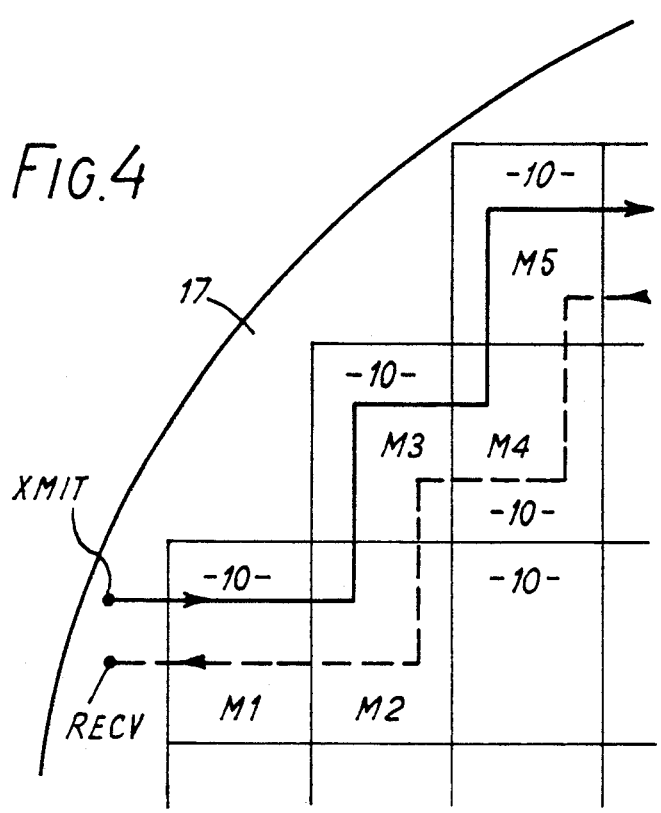
Figure 9:
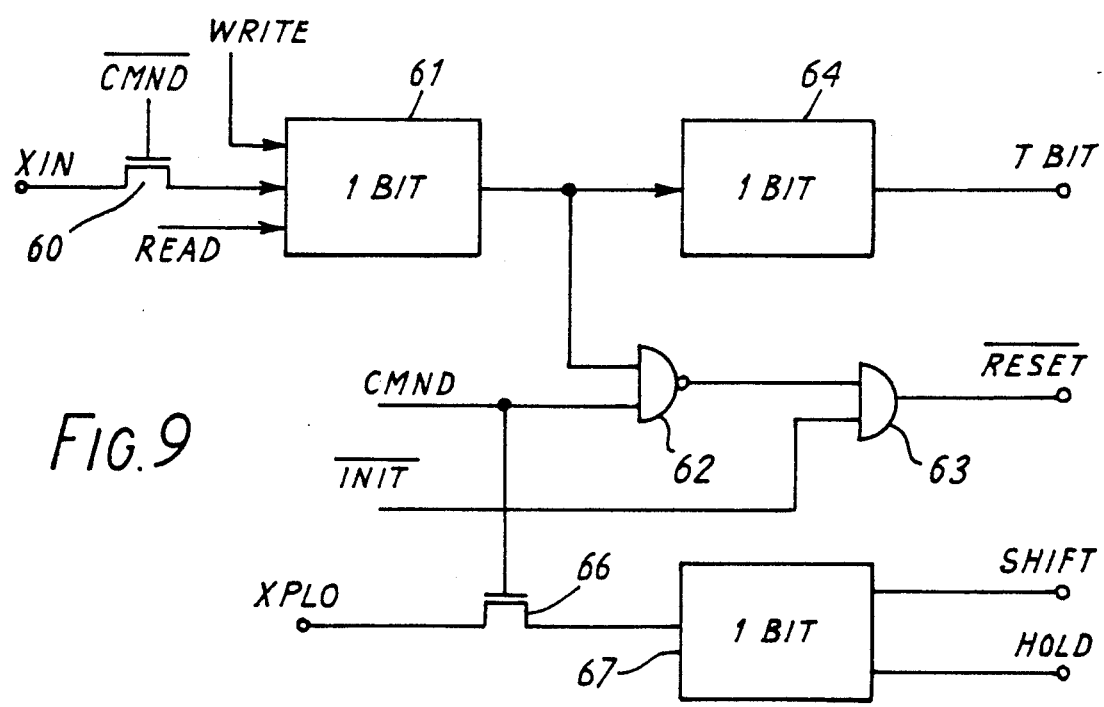
Figure 5:
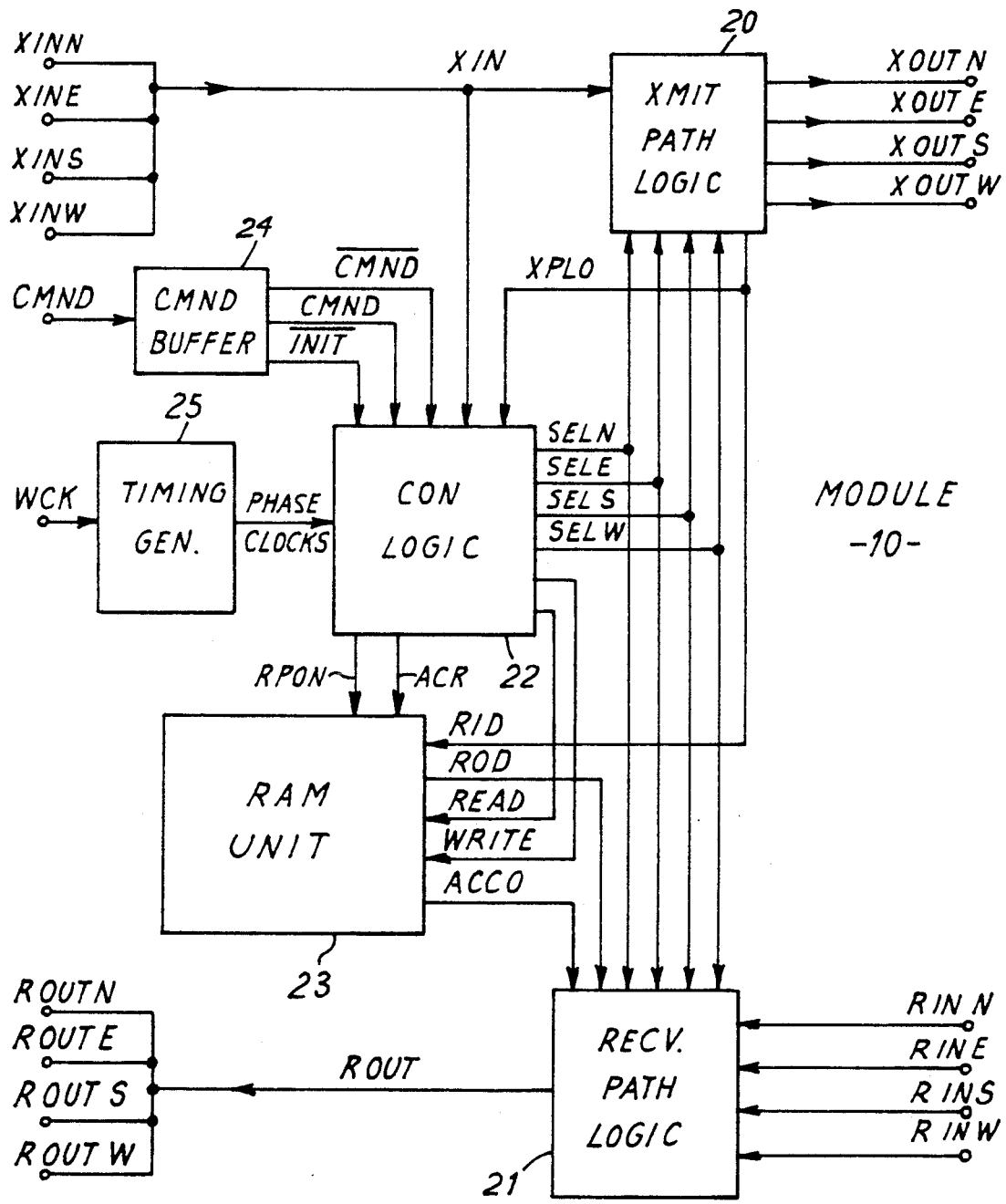
Figure 6:
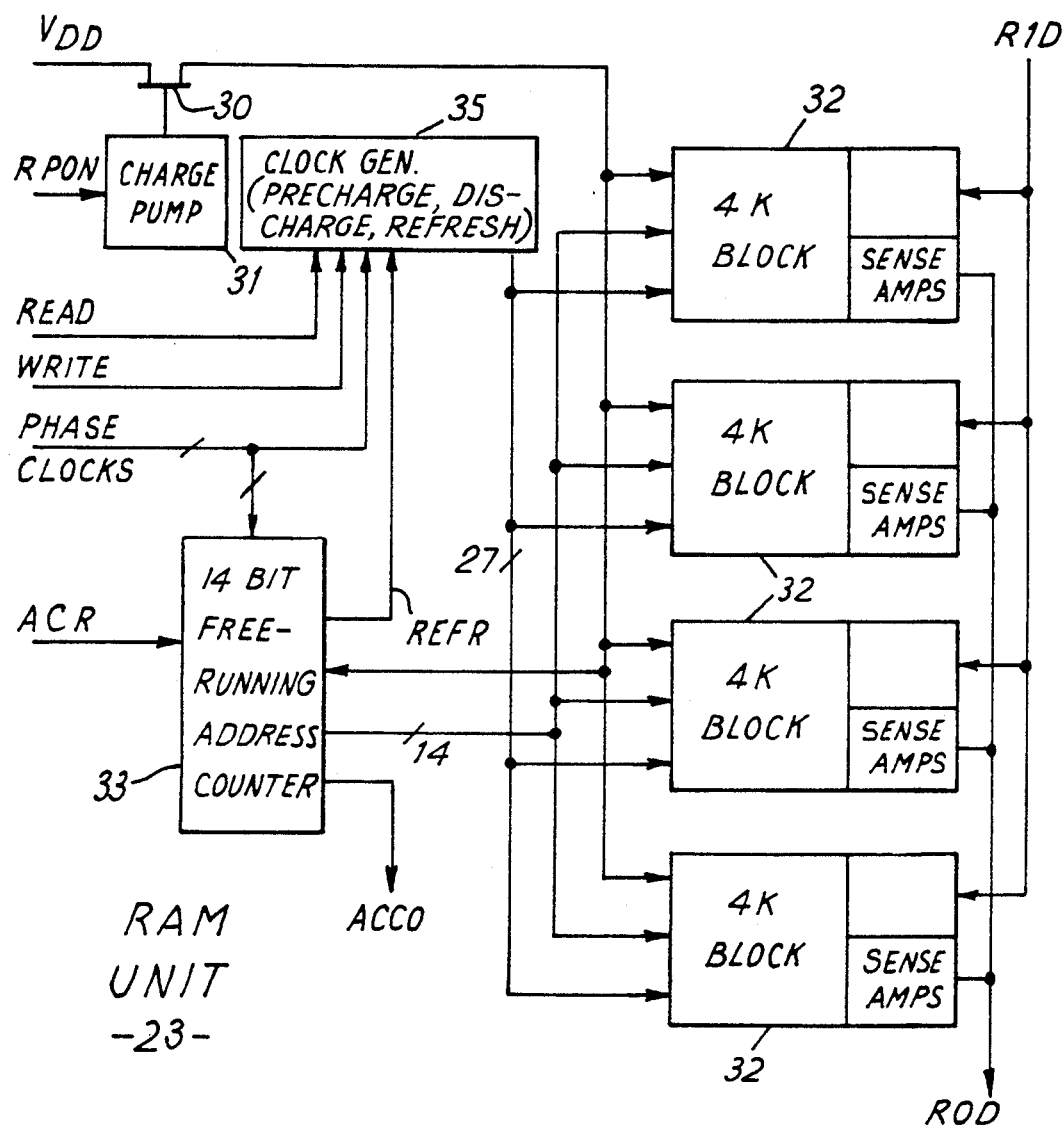
Figure 7:
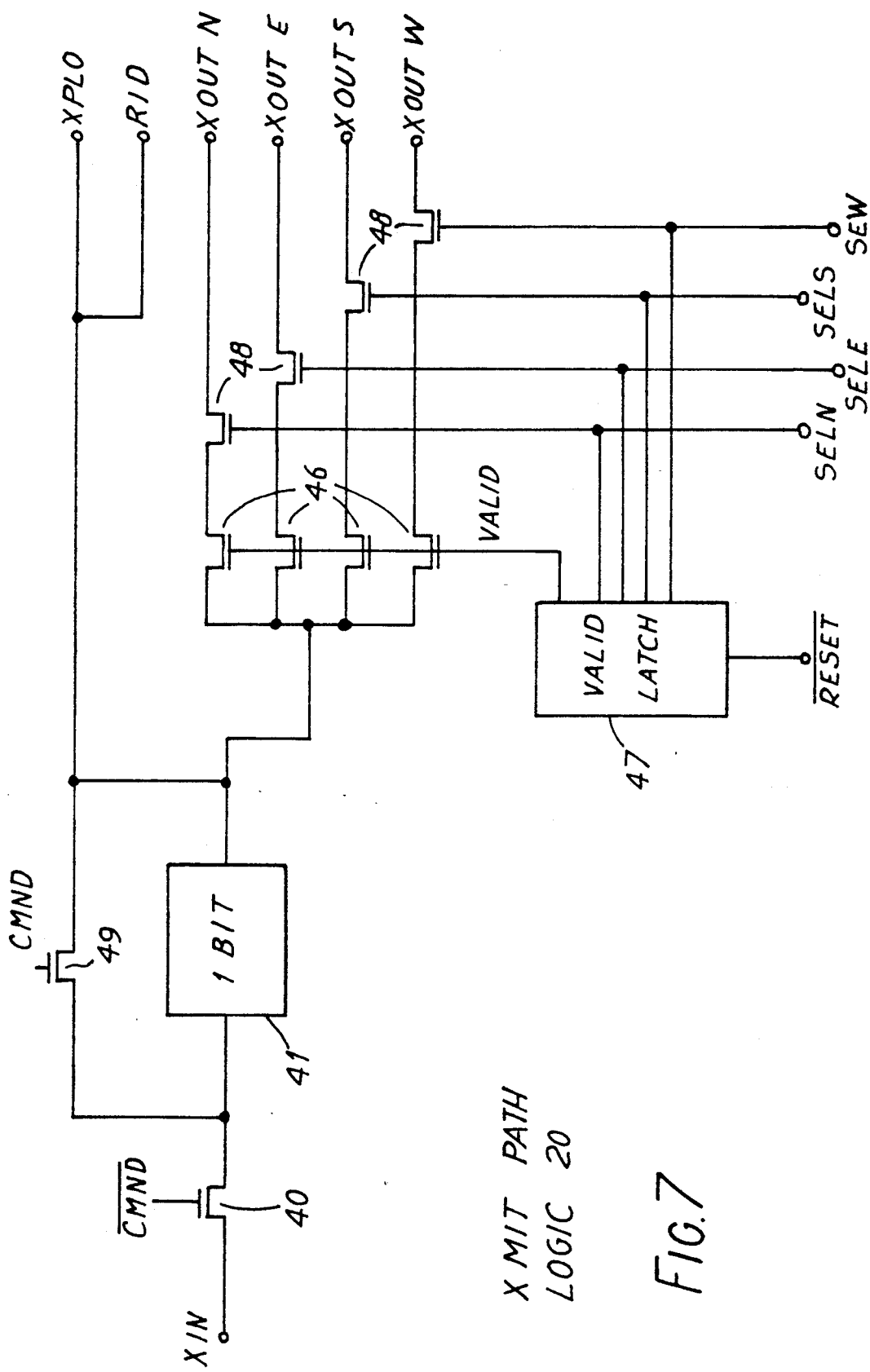
Figure 8:
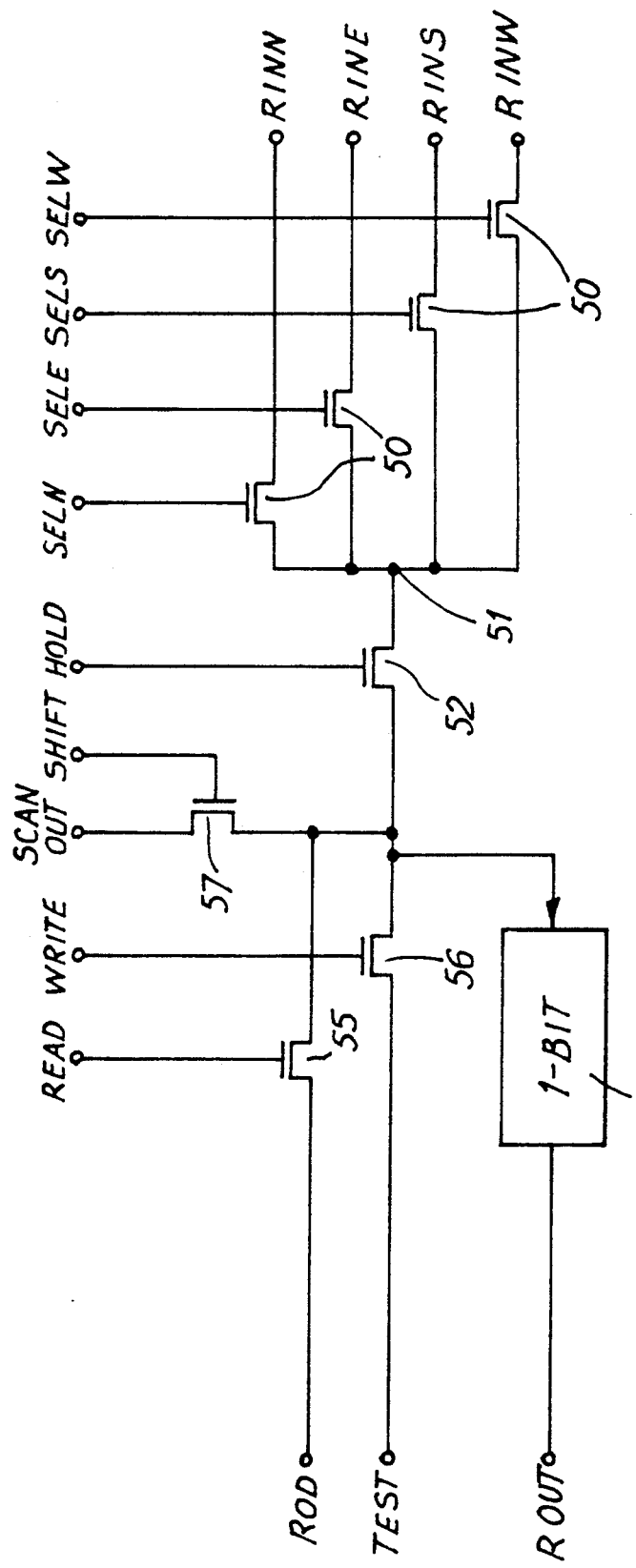
Figure 10:
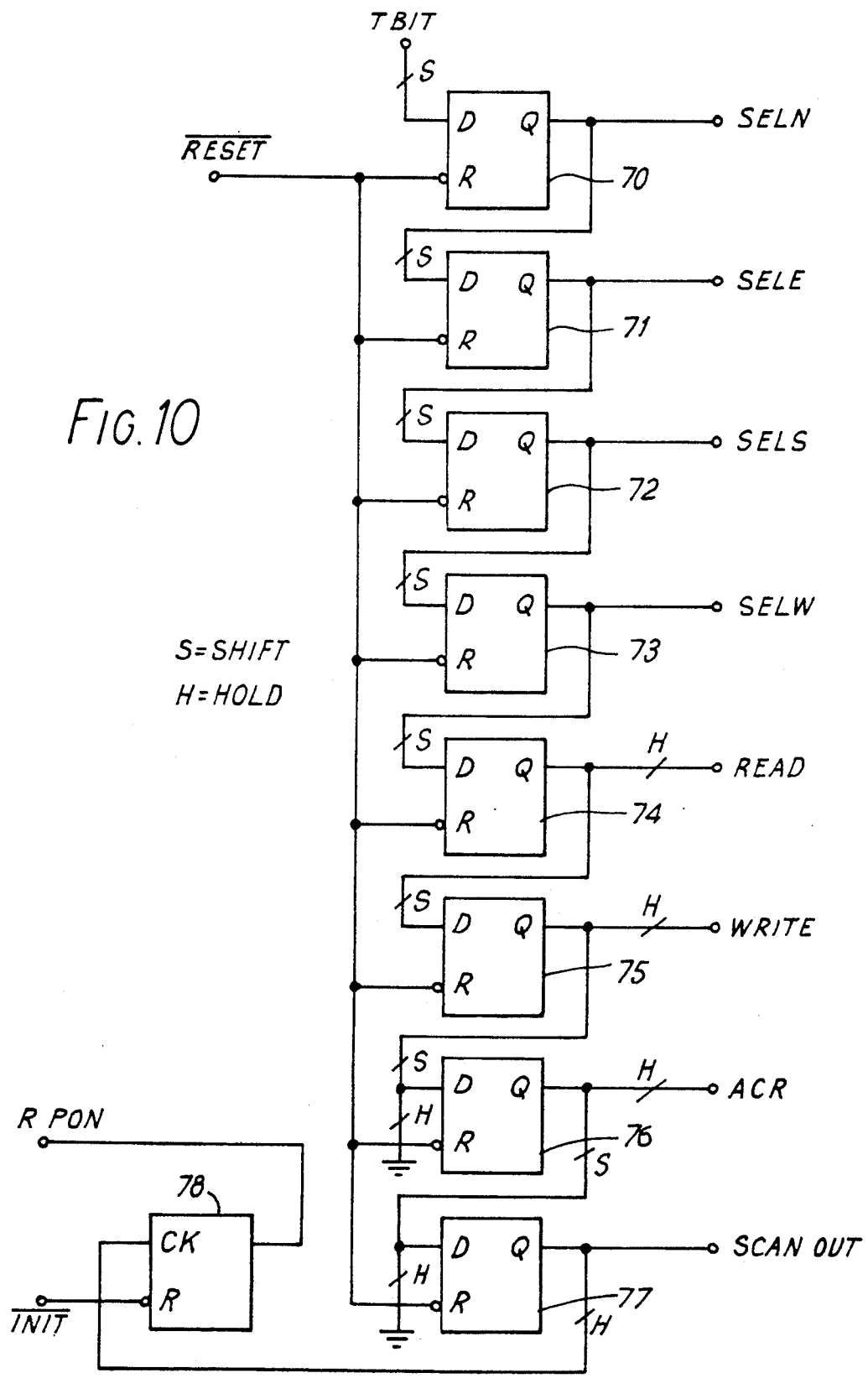
Figure 11:
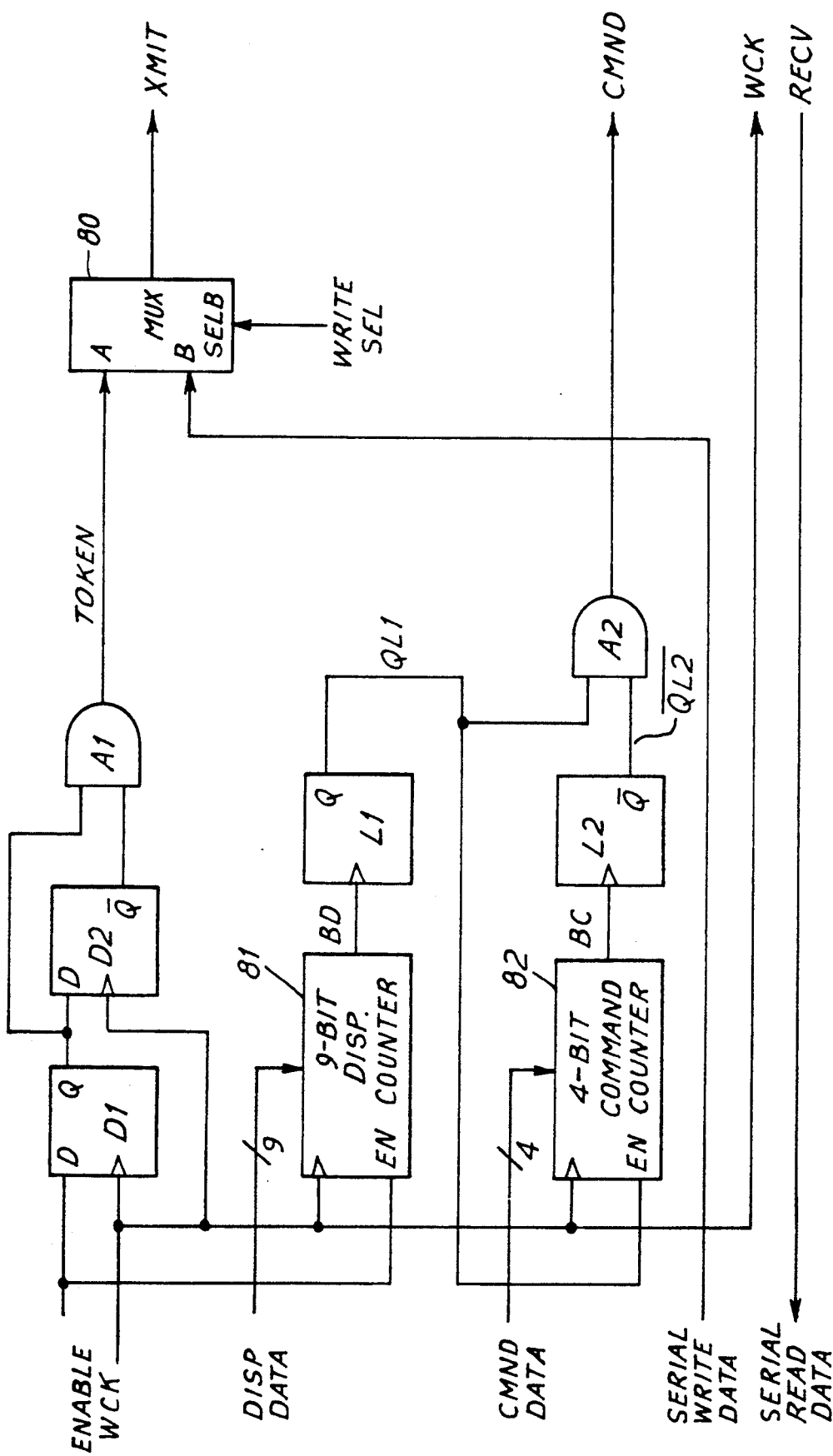
Figure 12:
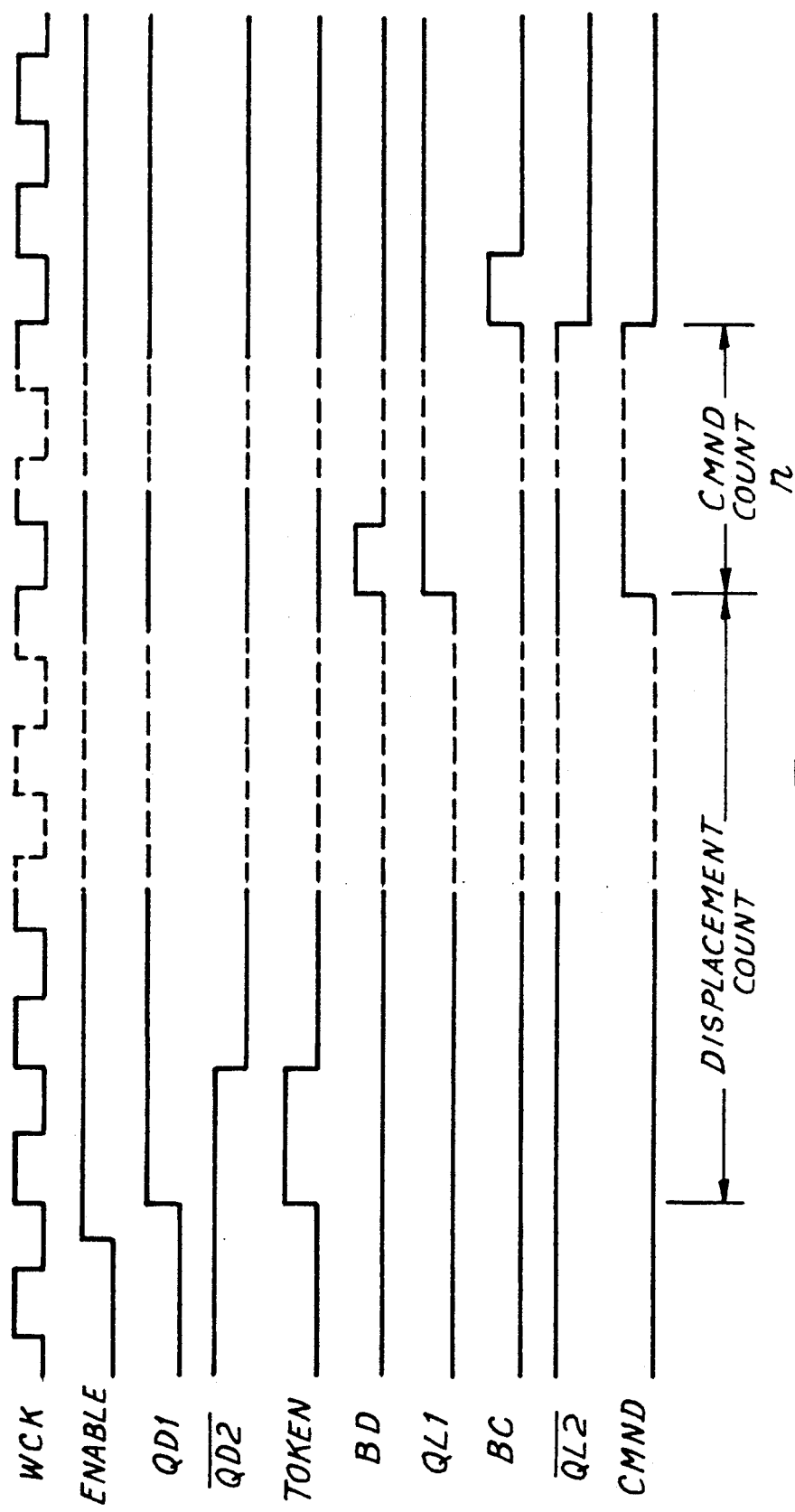
Figure 13:
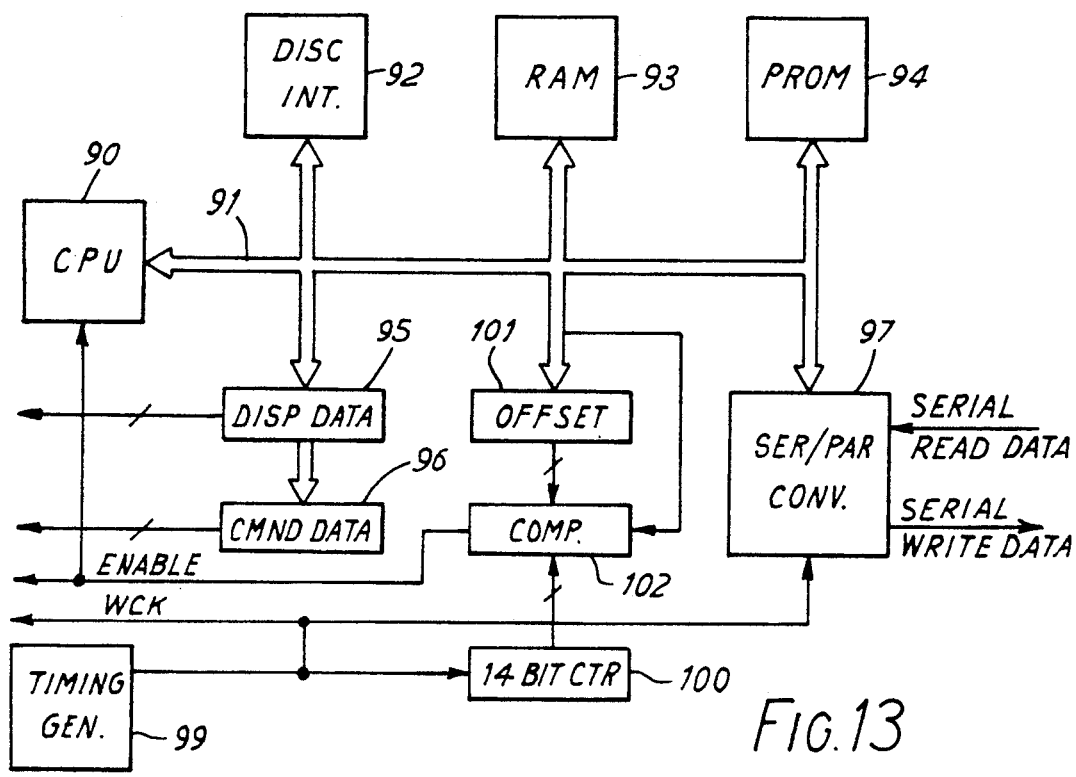
Figure 17:
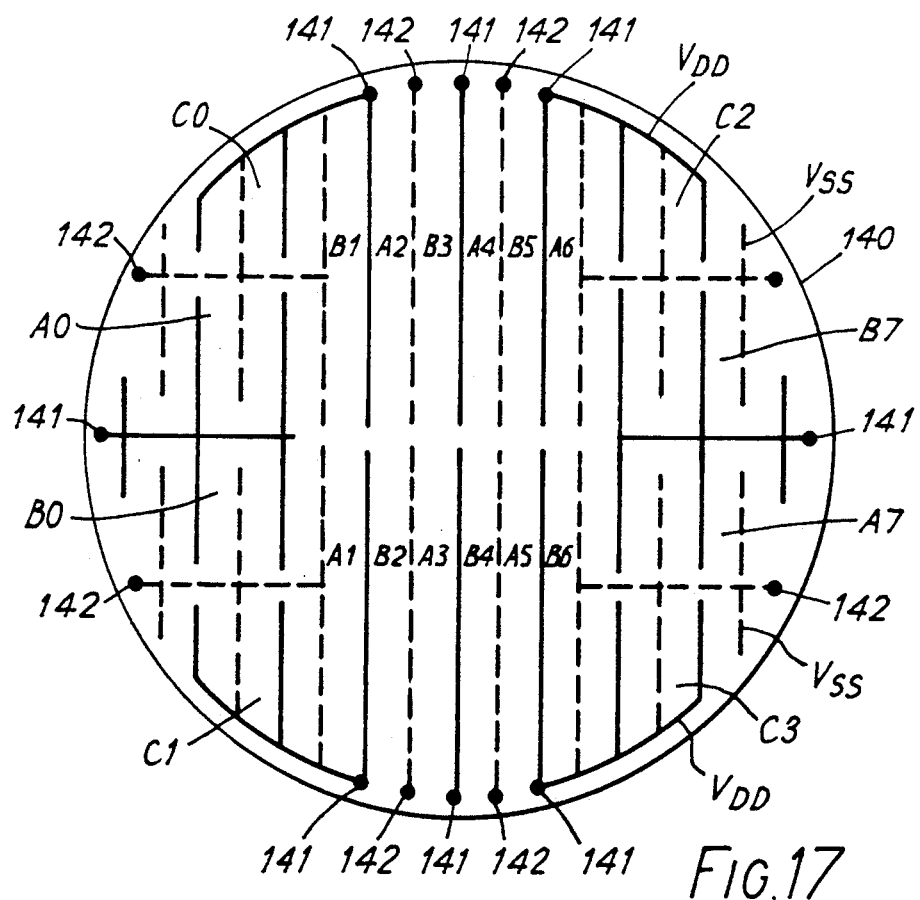
Figure 14:
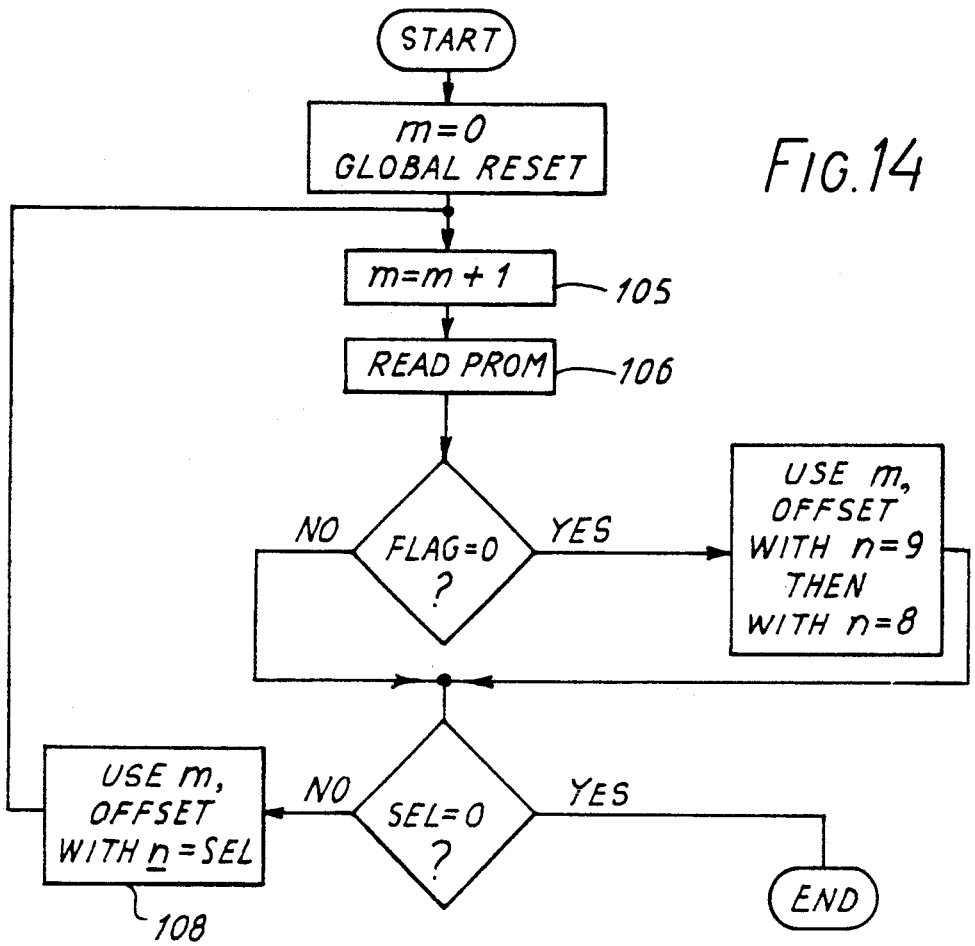
Figure 15:
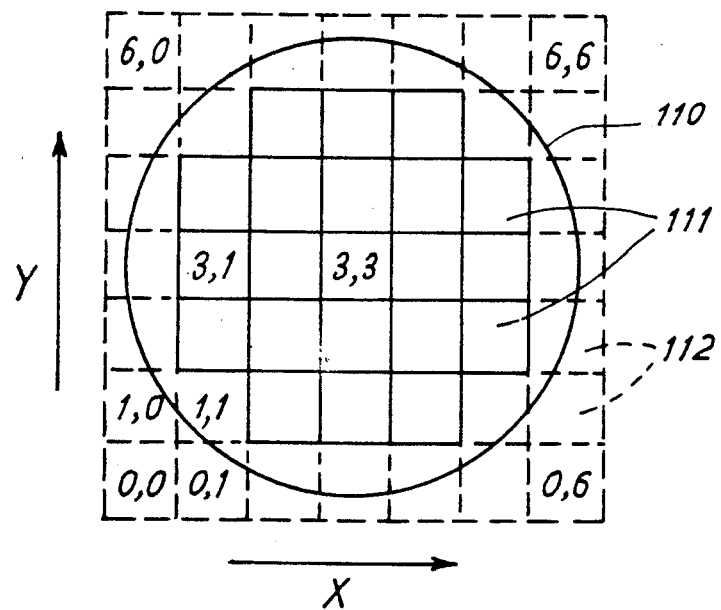
Figure 16:
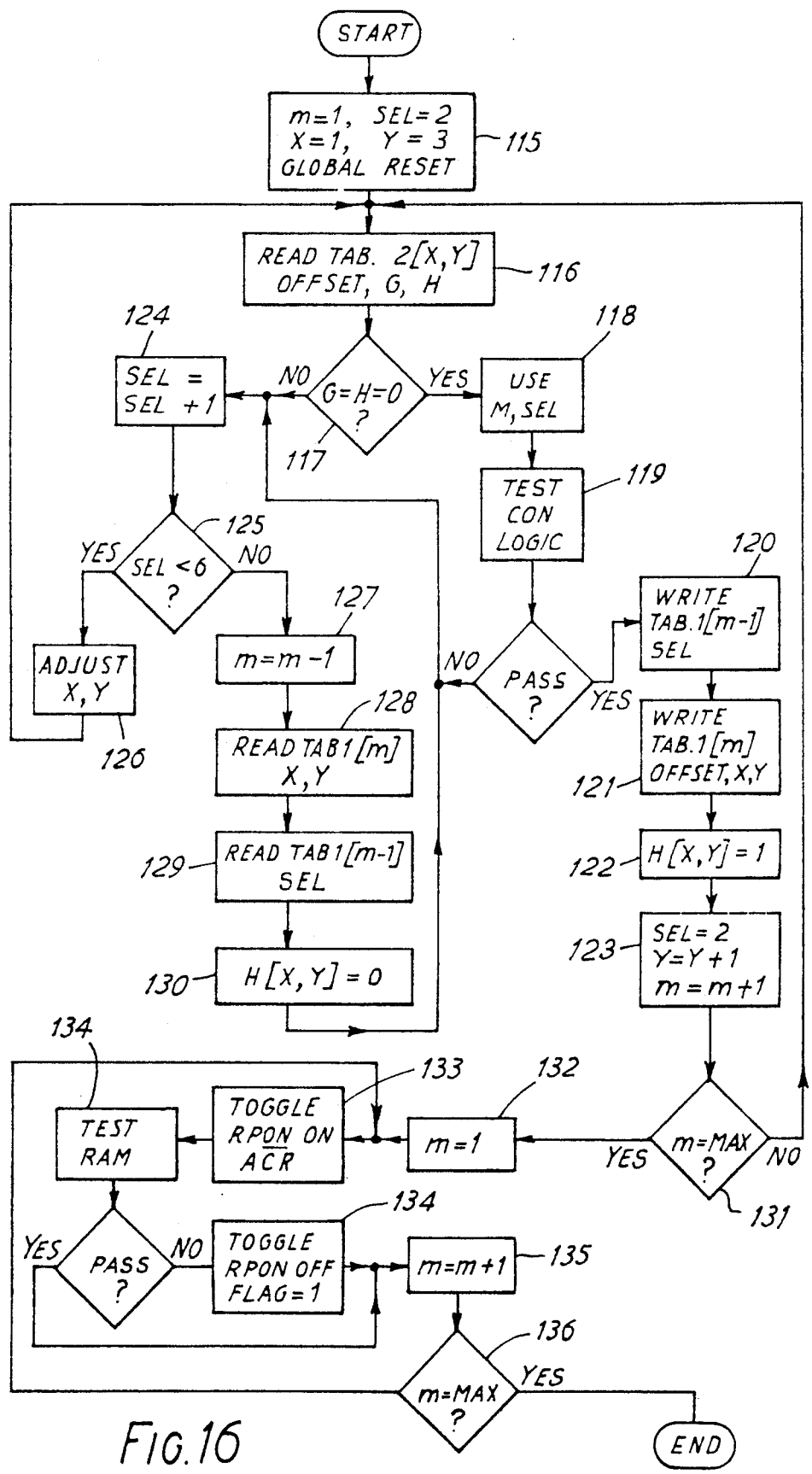
Figure 18:
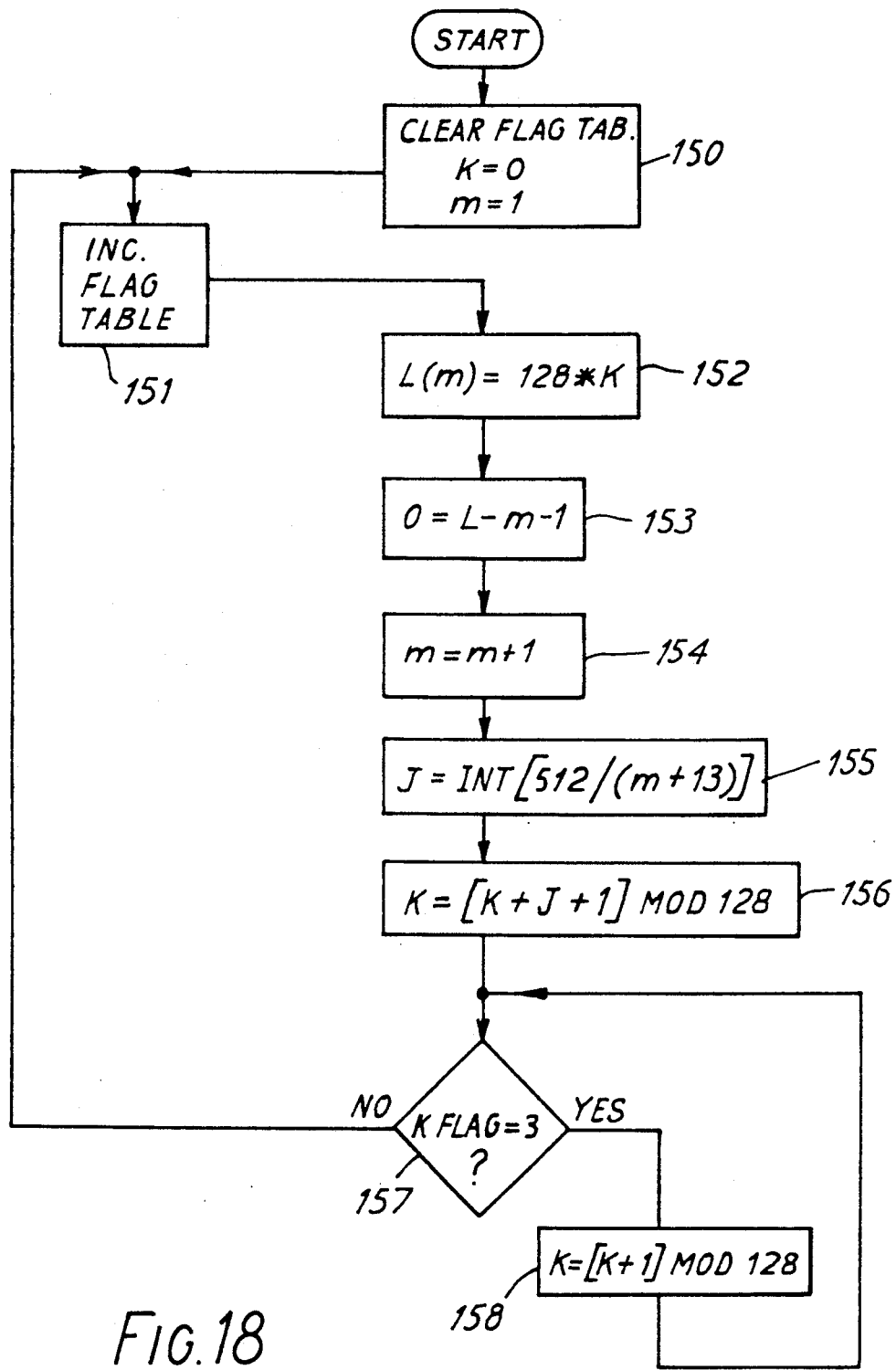

The invention will be described in more detail, by way of example, with reference to the accompanying drawings:

FIG. 1 shows part of a WSI circuit including global lines,

FIG. 2 shows part of a WSI circuit but shows the transmit path inter-module lines, FIG. 3 is similar to FIG. 2 but shows the receive path intermodule lines, FIG. 4 illustrates how a chain of modules is formed at the edge of a wafer, FIG. 5 is a general block diagram of a module, FIG. 6 is a block diagram of a memory unit forming the function unit of a module, FIGS. 7 and 8 are circuit diagrams of transmit and receive path logic respectively, FIGS. 9 and 10 are circuit diagrams of two portions of the configuration logic of a module, FIG. 11 is a block diagram of a circuit for sending commands to modules, FIG. 12 shows explanatory waveforms pertaining to FIG. 11, FIG. 13 is a block diagram of a host computer system making use of the WSI memory, FIG. 14 shows an algorithm for initializing the WSI memory each time it is switched on, FIG. 15 shows how the modules on a wafer may be numbered, FIG. 16 shows an algorithm for effecting initial growth of the chain, FIG. 17 shows zones of a wafer established in conformity with power supply conductors to the modules, and FIG. 18 shows an algorithm for calculating refresh offsets.

FIG. 1 shows some of the modules 10 on a wafer which may contain a few hundred modules arranged on the wafer. The modules are set in a grid of global lines, namely a $V_{DD}$ power line 11, a $V_{SS}$ power line 12, a WCK (wafer clock) line 13 and a CMND (command) line 14. All these lines go to bondsites on the edge of the wafer or WCK and CMND may go to a command module on the wafer.

FIG. 2 shows the same modules 10 minus the global lines but with inter-module lines 15 for transmit paths. Data may be sent through a chain of modules, starting at a bondsite identified as XMIT (transmit; not shown). The modules have four connections into their XMIT path and these connections are identified as follows:

XINN—from module above
XINE—from module to right
XINS—from module below
XINW—from module to left As shown in the right hand module only, these XIN lines merge into a single XIN terminal.

The modules have four connections out from their XMIT paths and these connections are identified as follows:

XOUTN—to module above
XOUTE—to module to right
XOUTS—to module below
XOUTW—to module to left.

Unlike the XIN lines, these output lines are switched so that a module can select only one of its edge neighbours as the next module in the chain, on to which XMIT data is passed.

The modules are also connected by receive path inter-module lines 16 (FIG. 3) which allow data to be sent back to a bondsite identified as RECV (not shown). The modules have four connections into their RECV paths:

RINN—from module above
RINE—from module to right
RINS—from module below
RINW—from module to left.

These connections are switched in correspondence with XOUT connections.

The modules have four connections out of their RECV paths:

ROUTN—to module above
ROUTE—to module to right
ROUTS—to module below
ROUTW—to module to left.

These connections branch, without switching, from an OUT terminal, so that return data is broadcast to all four neighbours, only one of which will have been set up to receive it.

The XOUT and RIN selections are effected by four selection signals SELN, SELE, SELS and SELW, whose generation is explained below. Only one of these signals can be true. If SELN is true, for example, the module routes the XMIT path to the adjacent module above and accepts RECV data from that module.

The SEL signals of the modules are set up basically as described in GB 1 377 859. Modules are added one by one to the chain, tested and retained if good, and the procedure is reiterated to grow a chain of interconnected modules. The chain tends to spiral in to the center of the wafer in the case of a peripheral bondsite for XMIT and RECV. There may be a plurality of such bondsites, say four, to improve the chance of finding a good place to start the chain. The testing is effected in stages in the present system, as described further below.

FIG. 4 illustrates a peripheral fragment 17 of a wafer with modules 10 and the bondsite terminals XMIT and RECV. Portions of the XMIT path and RECV path are shown in full and broken lines respectively, as they would be grown through modules in accordance with the algorithm that each module tries its selection options in the order SELN, SELE, SELS and SELW. The first module M1 fails with SELN (there is no module above it) but succeeds with SELE, so adding M2 to the chain. M2 succeeds with SELN and adds M3. M3 fails with SELN but succeeds with SELE, to add M4. M5 succeeds with SELN to add M5, and so on. In the example shown all modules are good, at least so far as their control logic is concerned.

Before turning to a full description of a module 10, a brief summary of the way in which it operates will be given. Normally the module merely acts as a link in the chain and outbound data and commands pass from XMIT through the XMIT path in the module with a 1-bit delay through each module. Inbound data returns to RECV through the RECV path in the module, also with a 1-bit delay through each module. Each module contains a 16 k×1 bit dynamic RAM unit which is constantly refreshed under control of a free-running address counter. The module also contains control logic which can respond to commands to effect SELN, SELE, SELS and SELW and to other commands of which the most important are READ and WRITE. When a module receives either of these commands, the chain is broken at that module and the RAM unit is written to in the case of WRITE and read from in the case of READ. Although the RAM unit is composed of random access blocks it is only addressed by the free running counter and treated as a 16 k block of serial memory. In a READ operation, all 16 k of memory are read out on to the RECV line. If the READ command is timed correctly in relation to the address counter cycle, the memory block will be read out correctly starting from address 0 and running through to address ($2^{16}-1$). If the READ command is not thus timed, the data will be "wrapped round"—in an address order N, ..., ($2^{16}-1$), 0, ..., (N−1) where N is the address obtaining at the READ command. The data can be accepted in this order at RECV and then cyclically shifted to establish the correct address order.

In a WRITE operation 16 k of data is written from XMIT into the RAM unit. The command and ensuing data can either be correctly timed in relation to the address counter cycle or can be prewrapped-round to match the address N at which the write starts. Another possibility is to write regardless and store the value in the address counter cycle marking the start of the written block, this stored value being used when the block is read to enable it to be correctly unwrapped.

After a read or a write operation, assuming that communication is then required to the more remote modules, it is necessary to send the appropriate SEL command to the module to re-establish the chain and it is accordingly necessary to maintain a record of the SEL command required by each module. Thus a table (Table 1 below) is established during initial testing and preferably then frozen in a PROM. However the table can be created afresh each time the device is switched on and be held in RAM or a RAM with battery back-up can be employed. The table identifies the modules simply by their number along the chain and provides information of the following kind, to take the example of FIG. 4:

TABLE 1

| ENTRY | SEL | OFFSET | FLAG |
|-------|-----|--------|------|
| M1 | E | | |
| M2 | N | | |
| M3 | E | | |
| M4 | N | | |
| M5 | E | | |

ENTRY is the table address. SEL requires two bits (e.g. 00=SELN, 01=SELE, 10=SELS and 11=SELW) but three bits is preferred to enable the end of a chain to be denoted by SEL=000, with SELN=010, SELE=100 and SELW=101. These values for SELN etc are convenient because, as will be described below, they directly yield the value of a number n which specifies the duration of CMND, which determines the command which an addressed module implements. OFFSET gives the number in the module's address counter at a datum address cycle time, corrected to take account of the time taken to access the module (1-bit delay through each preceding module). FLAG is a single bit which indicates whether the RAM unit of the module is usable. It is assumed that FLAG=0 means memory usable, FLAG=1 means memory unusable. Table 1 indicates the SEL directions in accordance with FIG. 4. The OFFSET and FLAG values are in general arbitrary and no values are shown. The way in which the values are obtained is explained below.

A more detailed description of a module will now be given with an explanation as to how the aforementioned facilities are provided and other features of the preferred embodiment.

FIG. 5 is a block diagram of one module. The four XIN terminals merge into XIN which forms the input to XMIT PATH LOGIC 20, within which the switching takes place to route the XMIT path to XOUTN, XOUTE, XOUTS or XOUTW. The four RIN terminals enter RECV PATH LOGIC 21 which selects one RIN terminal for connection to ROUT which branches to the four ROUT terminals.

XIN is also connected to CON LOGIC 22 (configuration logic) which decodes commands and provides the above-mentioned selection signals SELN, SELE etc and other commands, including READ and WRITE commands for a RAM UNIT 23. The command line CMND is fed to a clocked buffer 24 which provides complementary signals CMND (designating command mode) and $\overline{\text{CMND}}$ (designating "transmit mode"). Basically, in transmit mode the module acts simply as a link in the chain passing on both outward bound XMIT path data and inward bound RECV path data. In command mode the module detects whether a command token is present in its XMIT path logic and, if it is, decodes and obeys the command addressed thereto, i.e. timed to provide a token bit in that module when CMND goes true.

CMND, $\overline{\text{CMND}}$ and signals in general are gated with clock signals (described below) as is conventional in MOS circuits. For simplicity this design detail is ignored in the present description.

The buffer 24 also detects a global reset signal (CMND true for just one clock period) and generates an internal initialization signal $\overline{\text{INIT}}$ (i.e. initialization asserted when the signal is false). This is readily detected by logic which generates INIT BAR in response to the state sequence TMODE, CMODE, TMODE in successive clock periods. The initialization is global because $\overline{\text{INIT}}$ is generated by every module, regardless of what is received at XIN along the XMIT path itself. The use of global reset is described below.

The function unit of the module is a 16 k RAM UNIT 23. In the presence of WRITE, 16 k of data from the XMIT PATH LOGIC 20 is written into the RAM UNIT via a line RID (RAM input data). In the presence of READ, 16 k of data is passed to the RECV PATH LOGIC 21 via a line ROD (RAM output data).

A timing pulse generator 25 provides multiphase timing pulses PHASE CLOCKS in response to WCK. Although PHASE CLOCKS are shown connected only to CON LOGIC 22, they are of course distributed to the module circuits generally.

A module has seven mutually exclusive states as follows:
SELN—asserted (link to module above)
SELE—asserted (link to module to right)
SELS—asserted (link to module below)
SELW—asserted (link to module to left)
READ—asserted
WRITE—asserted
RESET—(none of the above asserted).

The CON LOGIC also provides a signal RPON (RAM power on) to switch on the RAM power supply. RPON is reset by $\overline{\text{INIT}}$ and can be toggled by a command addressed to a module. Another command provides a strobe ACR (address counter reset) to the RAM UNIT 23 to reset its address counter at the instant of the strobe.

The RAM UNIT 23 is not essential to the operation of a module as a link in a chain. It can be independently switched on and off by means of RPON. Thus the chain of "good" modules can be grown having regard to the operability of the control logic 20, 21, 22, 24, 25. If a module is encountered with bad control logic, the chain will have to be retracted and a new module in a different direction tried. This will be the situation at the edge of the wafer; a non-existent module will inevitably appear to be bad. The control logic is permanently connected to the power lines but is of small area and defects are unlikely to affect wafer yield much. However the RAM UNIT, if faulty, could draw heavy current and collapse the voltage on the power tracks 11 and 12 to which it is connected, so affecting large numbers of neighboring modules.

As shown in FIG. 6, the RAM UNIT 23 includes a switching transistor 30 which is controlled by RPON via a charge pump 31 which turns the transistor 30 on hard when RPON is true and connects $V_{DD}$ to four 4 k RAM blocks 32 and a free-running, 14 bit address counter 33 ($2^{14} = 16384$) which can be reset by ACR for a purpose described below. The RAM data inputs are connected to the common input line RID (RAM input data) which accepts data from the XMIT PATH LOGIC. The RAM sense amplifiers 34 are connected to the common output line ROD (RAM output data) which passes data to the RECV PATH LOGIC.

The detailed management of the RAM's is effected conventionally by a clock generator 35 which receives the PHASE CLOCKS, READ and WRITE and effects precharge, discharge, refresh and so on, in a manner which need not be described here. However it should be noted that the counter 33 comprises a 7-bit column counter (least significant half) and a 7-bit row counter (most significant half). Every time a carry propagates from the column counter to the row counter, a signal REFR is given to the clock generator 35 and the currently addressed row is refreshed in well known manner. Thus refresh takes place every 128 ($2^7$) clock pulses and a cycle of 128×128 clock pulses is required to refresh all rows of the RAM blocks 32.

The purpose of ACR is to enable the address counters 33 in the various modules to stagger their refresh cycles so that only a few RAM UNITS 23 are refreshing in any one clock period. The staggering is established by the way in which the values of OFFSET are determined in the aforementioned table. The staggering avoids excessive demands on the power lines and introduction of noise spikes.

The address counter carry bit is denoted ACCO (address counter carry out) and this may also be utilized in one test facility to be described below.

FIG. 7 is a detailed diagram of the XMIT PATH LOGIC 20. XIN is connected through an FET 40 enabled by $\overline{\text{CMND}}$ to a clocked 1-bit stage 41, from which drive is provided to the XOUT lines. Each such line includes a first FET 46 which is normally enabled by a validation latch 47 and a second FET 48 of which only one is enabled by the corresponding signal SELN, SELE, SELS or SELW. The validation latch 47 provides a safety feature. As will be described below, when a command is addressed to a module or $\overline{\text{INIT}}$ is asserted, the CON LOGIC asserts a reset signal $\overline{\text{RESET}}$ which resets any SEL signal which is set. Failure for this to take place is a recipe for disaster. If one SEL signal remains erroneously asserted when another is subsequently commanded, it is possible to have the chain branching from one module in an uncontrolled manner. This state of affairs is precluded by the validation latch 47 which is enabled by $\overline{\text{RESET}}$ and normally (with all of SELN to SELW false) latches the state which provides VALID and so enables all of the FET's 46. However, if any of SELN to SELW is true, the other state is latched to disable the FET's 46. This will prevent the module in question being used to add any other module to the chain, i.e. it becomes a totally bad module and during the chain growth and test phase, the chain will be retracted and re-routed to avoid this module.

When the module is merely being used as a link in the chain and $\overline{\text{CMND}}$ is accordingly asserted, XIN is connected to one of XOUTN, XOUTE, XOUTS, XOUTW through FET 40, 1-bit stage 41, one of the FETs 46 and whichever of the FETs 48 is enabled.

When the module is writing data to the RAM UNIT 23, $\overline{\text{CMND}}$ is again asserted and the data passes through the FET 40 and 1-bit stage 41 to RID.

The output of the 1-bit stage 41 is fed back to the input of the stage through an FET 49 which is enabled by CMND to form a 1-bit latch which latches the bit therein at the time CMND is asserted. This output is XPLO (transmit path latch out), which is physically the same as RID. XPLO is what tells the CON LOGIC 22 whether the module in question is addressed or not when CMND is asserted.

FIG. 8 shows the RECV PATH LOGIC 21. RINN, RINE, RINS and RINW are connected through respective FET's 50 to a node 51. The FETs 50 are enabled by SELN, SELE, SELS and SELW respectively. The node 51 is connected through an FET 52 enabled by HOLD and a clocked 1-bit stage 53 to ROUT. The function of HOLD will be explained below but, for understanding of FIG. 8 it suffices to know that it is true consequent on $\overline{\text{CMND}}$ is true, so that the module is established as a link in the chain, connecting the correct one of RINN to RINW to ROUT.

In order to transfer data from the RAM UNIT 23 to the RECV path, ROD is connected to the input of the 1-bit stage 53 through an FET 55 enabled by READ. As one test facility a terminal TEST is connected to the input of the 1-bit stage 53 through an FET 56 enabled by WRITE. TEST may be connected to RID (FIG. 7) so that when a write operation is performed, the data sent to the module in question along the XMIT path is returned from that module along the RECV path. The returned data can then be checked against the transmitted data. This may be useful as part of data verification procedures during normal use of the configured wafer.

Another use of TEST is implemented by connecting it to ACCO (FIG. 6). Then, during a write operation, a pulse should be injected into the RECV path every 16 k clock pulses. This may be useful to test the address counter 33 during the initial configuration procedures.

A further test facility, to be explained below is provided by a terminal SCAN OUT connected to the input to the 1-bit stage 53 through an FET 57 which is enabled by a signal SHIFT which is complementary to HOLD.

The CON LOGIC 22 will now be described. FIG. 9 shows one part of this circuit which generates the above mentioned signals $\overline{\text{RESET}}$, HOLD and SHIFT and a signal TBIT which is a token bit to be shifted along a shift register described with reference to FIG. 10. XIN is connected through a FET 60 enabled by $\overline{\text{CMND}}$ to a 1-bit stage 61. WRITE and READ are also connected to the stage 61 which performs an OR function. The output of the 1-bit stage 61 is gated in a NAND gate 62 with CMND to provide $\overline{\text{RESET}}$ which is also provided in response to $\overline{\text{INIT}}$ by an AND gate 63.

The operation of this part of the circuit is as follows. If, in transmit mode, XIN provides a 1-bit signal it is buffered in the 1-bit stage 61. If CMND is asserted before the next clock pulse, the output of the NAND gate 62 goes false to force the output of the AND gate 63 false and thus assert $\overline{\text{RESET}}$. RESET BAR is asserted willy-nilly if $\overline{\text{INIT}}$ is asserted, because this also forces the output of the AND gate 63 false.

The output of the 1-bit stage 61 is buffered for one more bit time by a stage 64 to provide TBIT (token bit) which is a bit to be clocked down the shift register (FIG. 10) so long as CMND is asserted. It should be noted that $\overline{\text{RESET}}$ can only be asserted and TBIT generated when (1) the transmit path latch 41 contains a 1-bit when CMND is asserted or (2) READ or WRITE is asserted when CMND is raised, irrespective of the contents of the transmit path latch. Case (1) represents the normal way of addressing a command to a module: asserting CMND at the time a 1-bit is present in the module on the XMIT path. Case (2) provides a means of aborting a WRITE or READ operation.

As explained above XPLO will be latched at 1 in an addressed chip. As shown in FIG. 9, XPLO is applied to a 1-bit stage 67 through an FET 66 enabled by CMND to provide SHIFT which enables the abovementioned shift register in order to clock TBIT along the register until CMND ceases to be asserted, and complementary signal HOLD.

Detailed timing considerations are not entered into here but the general situation is that XPLO is one bit delayed relative to XIN and SHIFT is a further bit delayed relative to XPLO. $\overline{\text{RESET}}$ is one bit delayed relative to CMND and TBIT is a further bit delayed. $\overline{\text{RESET}}$ is thus generated off the same bit as is latched to form XPLO and one bit later, this same bit appears as TBIT to be clocked along the shift register with SHIFT true.

FIG. 10 shows the remainder of the CON LOGIC 22, consisting of a chain of eight clocked D-type flip-flops 70–77 forming the shift register and a T-type flip-flop 78. The passage of signals is controlled by gates symbolically represented by small strokes with an adjacent S, meaning enabled by SHIFT or an adjacent H, meaning enabled by HOLD. The flip-flops 70 to 75 provide SELN, SELE, SELS, SELW, READ and WRITE respectively. Assuming that the module in question is addressed it can be seen that these six flip-flops will first be cleared by $\overline{\text{RESET}}$. Then TBIT will be clocked from flip-flop to flip-flop for as long as SHIFT remains true. When SHIFT becomes false and HOLD becomes true, which is when CMND goes false, the TBIT is latched in whichever flip flop it has reached.

If a 1-bit is sent down the XMIT path and CMND is asserted in the period in which that bit enters a given module and is then held true for n clock periods, n=2 will cause TBIT to be latched in flip-flop 70 (SELN), n=3 will cause TBIT to be latched in flip-flop 71 (SELE) and so on.

If n=8, TBIT moves on to flip-flop 76 which provides ACR but does not stay latched because HOLD puts ground on the D input. Thus n=8 provides a means for resetting the address counter 33 of the RAM unit 23.

If n exceeds 9, TBIT then moves past the flip-flop 77 which provides SCAN OUT. SCAN OUT is injected into the RECV path as described with reference to FIG. 8 and can be detected at the RECV terminal. The provision of SCAN OUT is a demonstration that the CON LOGIC 22 (excluding the flip-flop 78) is functioning. Accordingly it is satisfactory to use the module in the chain of modules, whether or not its RAM UNIT is functional.

If n=9, the flip-flop 78 is toggled. This flip-flop provides RPON and is reset by the global initialization signal $\overline{\text{INIT}}$. The preferred way of configuring the system is to apply a global reset (CMND true for one clock period, i.e. n=1) to ensure that all flip-flops, especially the RPON flip-flops of all modules are reset. The first module M1 (FIG. 4) is then tested with n greater than 9 and if SCAN OUT is detected back at RECV, all is well. If not another M1 must be selected and for this purpose there are say four XMIT, RECV bondsites around the periphery of the wafer connected to different modules.

The first module M1 is then commanded with n=2 to latch SELN. In FIG. 4 there is no wafer above M1 so when the notionally added M2 is tested with n greater than 9, SCAN OUT will not appear. M1 is therefore commanded with n=3 to latch SELE. M2 is tested with n greater than 9 and SCAN OUT appears. M2 is therefore commanded with n=2 to add M3 which is tested with n greater than 9, and so on. The module address table is built up to record for each module what its selection direction is.

When the maximum usage of the modules has been effected in this way, the RAM UNITS 23 are powered and tested one by one, e.g. sequentially from M1 onwards. M1 is therefore commanded with n=9 to toggle the flip-flop 78 on and assert RPON. The module is then commanded with n=8 to reset the address counter 33 by ACR at the desired time relative to the datum address cycle time thereby to determine the value for OFFSET to be entered in Table 1. The command resets SELE so the chain connected to XMIT again consists of M1 only although the more remote part of the chain remains intact. WRITE and READ are now employed using commands with n=7 and 6 respectively to see whether it is possible to write to the RAM UNIT 23 and reliably read back what was written thereby to determine the value of FLAG to be entered in Table 1.

If the module fails this test, it is commanded again with n=9 to toggle the flip-flop 78 again and set RPON false. Whether RPON is left true or set false, M1 is again commanded with n=3 to latch SELE and re-join the chain. M2 is now tested by using commands with n=9 (toggle RPON on), n=7 (WRITE) and n=6 (READ). RPON is toggled off if necessary and M2 is commanded with n=2 to latch SELN, whereafter the testing proceeds to, M3 and so on.

During this phase the aforementioned Table 1 is set up with its OFFSET and FLAG entries.

FIG. 11 shows the control circuitry for controlling the addressing of the modules. This circuitry may be off the wafer and interfaces with a control processor (not shown) which provides the necessary data and a strobe signal ENABLE which initiates a command operation. This processor stores the aforementioned table to enable it to time ENABLE and SERIAL DATA correctly.

When ENABLE goes true (see also FIG. 12) it generates a 1-bit token TOKEN via flip-flops D1 and D2, whose outputs QD1 and $\overline{QD2}$ are shown in FIG. 12, and an AND gate A1. The TOKEN is applied to XMIT via a multiplexer 80. ENABLE also enables (EN terminal) a 9-bit displacement counter 81 which is used to count the number of clock pulses to the module to be addressed. A 9-bit counter will handle a chain of up to 512 modules. The counter 81 will have been preset by the control processor with the correct initial value denoted DISPLACEMENT DATA and, when enabled, counts clock pulses WCK until a terminal count BD is reached. BD is latched in a latch L1 whose output QL1 enables a second counter 82 and also initiates CMND via an AND gate A2. The counter 82 is a 4-bit command counter preset in accordance with the desired duration of CMND by CMND DATA. When this counter reaches its terminal count BC a second latch L2 latches BC and the $\overline{QL2}$ output of this latch disables the gate A2, so terminating CMND. A 4-bit counter 82 suffices to set up all desired durations of CMND from n=1 clock period (global reset) up to n=10 clock periods as required by the CON LOGIC 22 of FIG. 10.

Although not illustrated, $\overline{QL2}$ may be used to reset the latches D1, D2, L1, L2.

When a WRITE command is set up the controlling processor must feed the serial data to XMIT after CMND has gone low again and in doing this it applies a signal WRITE SEL to the multiplexer 80 to connect SERIAL WRITE DATA to XMIT. When a READ command is set up, the controlling processor must be ready to accept serial read data from RECV m clock pulses after the termination of CMND, where m corresponds to the displacement of the addressed module from RECV.

For simplicity and in order to avoid a greater risk of anomolous conditions it is preferred to assert CMND when there is only a single bit Token on the XMIT path. If more than one bit is on the path, multiple addressing will occur, with the same command given to all addressed modules, because this is determined by the duration of CMND. A single bit Token can be used to address a plurality of modules in sequence. The bit is latched in the latch 41, 42 (FIG. 7) and, when a command is terminated at one module, can continue to another module, which is addressed when CMND is asserted, provided the one module is in a state with one of its SEL signals asserted.

There are three reset modes for a module. As explained above, raising CMND for one clock period only asserts $\overline{INIT}$ in all modules, clearing the shift register stages 70-77 (FIG. 10) in all modules and also lowering RPON in all modules. Secondly, there is an addressed reset in that $\overline{RESET}$ is asserted in just the addressed module to clear the shift register stages 70 to 77 before the token TBIT is shifted in. Thirdly, these shift register stages are cleared if CMND is raised while the module is set to READ or WRITE, by virtue of the connections to amplifier 61 in FIG. 9. This is termed "operation reset" and may be used in various ways called termination with onward addressing (TOA), termination with path closure (TPC) and ABORT.

TERMINATION WITH ONWARD ADDRESSING (TOA).

In the case of the WRITE operation, a '1' is appended to the end of the write data stream so that, when CMND is raised AT THE END of the write operation, the module performing the write sees a '1' in its XMIT path latch. The module is therefore once again an addressed module; raising CMND resets the shift register 70-72, so terminating the write operation and a new onward path from the module may then be selected, by keeping CMND high for the appropriate number of clock pulses. In the case of the READ operation, a similar scheme pertains, save that in this case the command token must be injected into the XMIT path at such a time that it arrives at the target chip when or after the last bit of data is being read out on to the RECV path.

TERMINATION WITH PATH CLOSURE (TPC) and ABORT are explained in GB 2177825 (corresponding to U.S. Ser. No. 02 7167 filed 12 Mar. 1987)

The ways in which the staggering of the refresh cycles of the address counters may be handled will now be considered. Firstly, the value of OFFSET will be considered more carefully. It is assumed that the master timing for the wafer is determined by an off-chip timing generator which provides WCK and also drives a master 14-bit counter which establishes a reference address cycle. The module address counters 33 run with LOCAL OFFSETS relative to the reference cycle. OFFSET however is the offset as seen at the command circuit (FIG. 11) and the following relationship exits:

OFFSET = LOCAL OFFSET − m − 1 for the $m^{th}$ module counting from the bandsite. This may be symbolized also as $$O = L - m - 1$$

Accordingly, if it is desired to give the $m^{th}$ a local offset L, the token bit must be launched in the $0^{th}$ bit period of the master counter and CMND must be asserted during the $L^{th}$ bit period of the master counter and be held true for 8 clock pulses. In other words, in FIG. 11, ENABLE must be asserted in the $(0-1)^{th}$ bit period of the master counter, DISP DATA is given by m and CMND DATA is 8.

FIG. 13 shows the arrangement necessary to control the hardware of FIG. 11. A CPU 90 communicates via a bus 91 (data, addresses, control lines) with a disc interface 92, a RAM 93, a PROM 94, a register 95 for DISP DATA, a register 96 for CMND data, and a serial/parallel bi-directional converter 97. A timing generator 99 provides WCK and a 14-bit counter 100 counts WCK. The CPU also communicates with an OFFSET register 101 and a comparator 102, when enabled by the computer, compares the contents of the counter 100 with the contents of the OFFSET register 101 and emits ENABLE when there is a match.

Consider firstly operation when the PROM 94 has been set up with its contents SEL, OFFSET and FLAG forming the aforementioned Table 1. The CPU 90 identifies modules by their module number which corresponds to the address in Table 1 relative to a base address of the PROM. The use of FLAG can be dealt with very briefly. If any attempt is made to read or write to a module lacking usable memory, an error (no memory present) will be signalled since FLAG is tested for any such access.

Whenever the CPU wishes to command a module it writes the module number in the DISP DATA register 95, writes the number corresponding to the desired command in the CMND DATA register 96 and writes the value of OFFSET obtained from the PROM 94 in the register 101. If the command is to reconnect the module to the next module in the chain, the value to be written into the CMND DATA register is also read from the PROM 94 (i.e. the SEL entry therein). When the registers 95, 96 and 101 have been set up, the CPU 90 enables the comparator 102 which emits ENABLE when the counter 100 reaches the value OFFSET. ENABLE triggers the circuit of FIG. 11 to operate in the manner already described.

ENABLE is also provided as an interrupt to the CPU 90 to enable the CPU to control read and write operations via the converter 97. In the case of a write operation, the CPU transfers the first word to the converter and starts clocking out serial data from the converter 97 in the next clock period. Thereafter the CPU reads a new word into the converter 97 every w clock pulses WCK, where a word is w bits, and terminates clocking out serial data when 16 k bits have been clocked out. A read operation is complementary but the CPU has to cause the converter 97 to start clocking in serial data 2m + 6 bit tines after ENABLE has launched the token bit where 2m bit tines correspond to the propagation tine along the chain to the $m^{th}$ module, and back again, and 6 is the value of n corresponding to the command READ.

The detailed implementation of these operations is not considered here since it is apparent that they may either be controlled by the CPU 90 or the converter 97 may incorporate hardware for effecting direct memory accesses to the RAM 93, counting 2m + 6 clock cycles and counting 16 k = $2^{14}$ clock cycles.

In order to reset a module's address counter 33, it is merely necessary to proceed as described above with the module number m and the corresponding value of OFFSET in the registers 95 and 101 and the number n = 8 causes the generation of ACR, as described with reference to FIG. 10.

Initial growth of the chain is effected by the algorithm shown in FIG. 14. After initializing m to zero and effecting global reset, m is incremented (block 105) and used (block 106) as the address offset in reading the PROM 94. FLAG is then tested and, if FLAG = 0, the module is commanded with n = 9 (block 107) so as to toggle on the memory power supply and is then commanded with n = 8 so as to reset the address counter to the value determined by OFFSET. These operations are skipped if FLAG = 1.

SEL is then tested. If SEL = 0, the chain is complete. If SEL is other than 0, the module is commanded (block 108) with n = SEL so as to connected on to the next module in the chain. The algorithm then returns to block 105 so as to deal with the newly added module.

The way in which the chain is initially grown will now be considered. Referring firstly to FIG. 15, a simplified wafer 110 is shown with an array of modules 111 thereon. These modules are treated as members of a rectangular array of modules including the real modules 111 and phantom modules 112. For simplicity, FIG. 15 is restricted to a 7×7 array. In practice the array may be at least 20×20. The reason why the modules are treated in this way is that each module may be identified by X and Y coordinate values where X and Y each run from 0 to 7. Moreover, a table may be set up into which X and Y point. Each entry in the table holds three pieces of information. One is a flag G which indicated whether or not the module exists. G = 0 means the module exists. G = 1 means the module is a phantom module. A second piece of information is a predetermined value of OFFSET to be assigned to the module in Table 1. The values of OFFSET can be determined in such a way that refresh cycles are suitably staggered, as explained below.

The third item in Table 2 is a flag H which indicates whether the module is in the chain or not. Structurally Table 2 may be as follows:

TABLE 2

|  | G | OFFSET | H |
|---|---|---|---|
| Y = 0 X = 0 |  |  |  |
| X = 1 |  |  |  |
| X = 2 |  |  |  |
| X = 3 |  |  |  |
| X = 4 |  |  |  |
| X = 5 |  |  |  |
| X = 6 |  |  |  |
| Y = 1 X = 0 |  |  |  |
| . |  |  |  |
| . |  |  |  |
| X = 6 |  |  |  |
| Y = 2 X = 0 |  |  |  |
| . |  |  |  |
| . |  |  |  |
| Y = 6 X = 6 |  |  |  |

Again values for G, OFFSET and H are not shown.

For a given product the values of G and OFFSET are all predetermined and they may be read into the table in the RAM 93 from a disc memory, via the disc interface 92. The CPU 90 then embarks on growing the chain of modules and, in so doing it updates Table 2 (the H entries) and creates Table 1 in RAM. In this process the CPU keeps track of which module is currently last in the chain by means of the X and Y values which are stored at two RAM locations. Whenever a new module is to be added to the chain by means of SELN, SELE, etc X or Y is incremented or decremented as is appropriate. It can readily be seen that the required operations are as follows:

SELN—Y=Y+1
SELE—X=X+1
SELS—Y=Y−1
SELW—X=X−1

The bondsite is taken to be the module 3, 1 (FIG. 15). A very simple growth algorithm may be employed, which is try SELN, SELE, SELS and SELW in that order of preference, although more sophisticated algorithms may be employed in order to reduce the number of modules which get left out of the chain. FIG. 16 shows an example of a growth algorithm.

In block 115 initial values are set up as m=1 (first module in chain), SEL=2 (i.e. SELN), X=1, Y=3 (i.e. module 1 is bondsite module) and global reset is commanded. The next block 116 in the flow-chart is treating the module m as a potential new module to be added to the chain. In this block, the value of OFFSET is read from Table 2 and so are the flags G and H. A test 117 is then performed to see if the module is available for adding to the chain, which requires G=H=0. Naturally the bondsite module must satisfy these requirements. If the module is available block 118, acts to add the module by reverting to m−1 and the current value of SEL, which remains that pertaining to the preceding module. Block 118 has no effect on the bondsite module; it is already connected to XMIT and receive.

The newly added module is then tested (block 119) using SCAN OUT, as described above, to see if its CON LOGIC is functional. Assuming that it passes this test (if it is the bondsite module it must), Table entries have to be updated as follows:

In block 120 entry m−1 of the Table 1 is completed with SEL. In block 121, entry m of Table 1 is begun with the entry of OFFSET (read in block 116). Moreover the values of X and Y are held in Table 1 as they will be required, should it become necessary to retract the chain, as described below. In block 122 the flag H for the current values of X and Y is set to signal that the added module is in the chain. In block 123, SEL is reset to 2 and Y is incremented to point in to the module above that added to the chain. m is incremented. The algorithm reverts to block 116.

If test 117 fails, it is necessary to try the next value of SEL from module m−1. Accordingly in block 124, SEL is incremented. A test 125 is made to see if SEL remains less than 6. If SEL reaches 6, possibilities from m−1 have been exhausted and it is necessary to revert to a retraction routine described below. Assuming that SEL remains less than 6, block 126 adjusts X and Y to point to the new module. The adjustments are readily seen to be as follows, where SEL is the new value of SEL:

| | | |
|---|---|---|
| SEL = 3 | Y = Y − 1, | X = X + 1 |
| SEL = 4 | Y = Y − 1, | X = X − 1 |
| SEL = 5 | Y = Y + 1, | X = X − 1 |

The algorithm again reverts to block 116.

Similarly, if test 119 fails, it is necessary to pass to block 124.

If test 125 shows that all possibilities from m−1 have been exhausted, it is necessary to go back to m−2 and try the next route therefrom. Therefore (block 127), m is decremented. The values of X and Y for module m are read from Table 1 (block 128) and the value of SEL for module m−1 is also read from Table 1 (block 129). In entry X, Y in Table 2, the flag H is reset (block 130). The algorithm reverts to block 124.

The illustrated algorithm assumes that the chain is grown simply until it reaches a desired length m=MAX, test 131. An alternative is to grow the chain to the maximum length possible. If m has not reached MAX, the algorithm reverts from block 123 to block 116 as described above, but if m=MAX, growth ceases and the RAM UNITS are tested one by one. m is reset to 1 (block 132) and the RAM of module m is powered by toggling RPON and the address counter is reset using ACR with the value of OFFSET from Table 1, as described above (block 133). Then (block 134) the RAM is tested as described above. If it fails the test, block 134 toggles RPON to remove power from the RAM. FLAG is also set to 1 in Table 1 to signal an inoperative RAM. In any event, the algorithm proceeds to increment m (block 135) and, after another test 136 for m=MAX, reverts to block 133. If m=MAX, the growth algorithm has completed its course.

Table 1 has now been created in the RAM 93 (FIG. 13) and may now be written into the PROM 94, without the X and Y entries which are only needed in the initial growth algorithm, for subsequent use in the simple algorithm of FIG. 14. However it is clearly not essential to fix Table 1 in a PROM. It may be saved on disc and loaded into RAM whenever the chain is to be regrown using the simple algorithm. If the RAM 93 is non-volatile it may nominally be held in RAM. The RAM holding Table 1 may be on or off the wafer. At any time, Table 1 may be recreated using the full algorithm of FIG. 16, which may be held on disc. This full algorithm may be used every time the wafer is switched on, although it may take of the order of 1 second per module to implement.

The values for OFFSET are simply taken from Table 2 which is created with some scheme of values which ensures that refresh cycles are suitably staggered. This is a trival problem and the numbers may be assigned by inspection and a little trial and error. However FIG. 17 illustrates a suitable approach. A typical pattern of power supply conductors for a wafer 140 is shown, consisting of $V_{DD}$ conductors in solid lines and $V_{SS}$ conductors in broken lines, with bondpads 141 and 142 respectively. The modules lie in columns between the conductors as in FIG. 1. They are treated as grouped in zones A0 to A7, B0 to B7 and C0 to C3. Within a zone, modules are fed from the same $V_{DD}$ and $V_{SS}$ lines and all modules within any one zone have unique L (LOCAL OFFSET) numbers. The available L numbers are integral multiples of 128 (0, 128, 256 ... 255×256) since there is no virtue in coping with the complexity of overlapping refresh cycles. The A, B and C zones have mutually exclusive subsets of the full repertoire of 128 refresh numbers. At the zone boundaries, a $V_{DD}$ or $V_{SS}$ conductor is flanked by zones from two different groups. Therefore modules on such a conductor never refresh simultaneously. Morever zones from the same group are always separated by a zone from a different group, e.g. B1 and B3 are separated by A2. Therefore zones in the same group can have refresh numbers in common. It is sufficient that the A, B and C zones have their numbers drawn from the mutually exclusive subsets and that, within any one zone, all numbers are unique.

An alternative approach is assigned local offsets to dynamically during the growth algorithm, in such a way as to reduce the average latency in accessing a module. It may be assumed that, if module m has just been accessed, there is a strong possibility that module m+1 will be wanted next and refresh numbers can be assigned to minimise the latency in accessing m+1. Consider the case of writing to module m and then to module m+1. The 16k block of data written to module m terminates at the module itself as the address counter 33 therefore is just about to overflow from $2^{14}-1$ to zero. Assuming that TOA (described above) is used, the module can be commanded to reconnect to the next module in the chain within a few clock cycles (5 cycles for the worst case of SELW). To write to the next module m+1 (which requires n=7) requires m+1+7 clock cycles are ENABLE to implement the command. Therefore m+13 clock cycles must be allowed before the new write operation. Provided m+13 is less than 128, the module m+1 can have the next refresh number L+128. If m+13 is greater than 127 but less than 256, the module m+1 can have the next refresh number but one, i.e. L+256, and so on.

An algorithm based on this approach is shown in FIG. 18 with the assumption that m+13 is always less than 512. This algorithm can be used in the algorithm of FIG. 16 to determine OFFSET, instead of looking this up from Table 2 including predetermined values. Each value of L is determined from a refresh index K in accordance with the relationship L=K * L. K ranges from 0 to 127 and each value of K can be used up to four times. A table is maintained with a flag value for each value of K. All flag values are initially set to zero.

This takes place in block 150 in which K is initialised to 0 and m to 1. The flag for this value of K is then incremented (block 151) and L(m) is computed as L=128 * K (block 152). In block 153 OFFSET is computed as 0=L−m−1. In block 154 m is incremented and a value J to be used in incrementing K is computed block 155 as $$J = INT[512/m+13)].$$

J will range from 0 to 3. In block 156, K is determined as K=[K+J+1]MOD 128. In decision block 157 the table is inspected to see if this value of K remains free; it is not free if the flag has reached 3. In this event the next value of K is formed (block 158) and the algorithm reverts to test 157. Once a free value of K is found (K flag not equal to 3), the algorithm reverts to block 151.

It will be realised that this algorithm leads to a completely determinate set of values for OFFSET, which could therefore be set up in Table 1 ab initio. Moreover there is no guarantee that use of the algorithm will suffice to avoid simultaneous resets on the same supply conductor although there is a good chance this objective will be met. However, the algorithm can be adapted to a modified form of the zoning approach of FIG. 17. The zone of a module can clearly be determined from its X and Y values and, if the K values permitted in each zone are tabulated, block 156 of FIG. 18 may be followed by a modification of blocks 157, 158, 151, whereby a check is made to see if the K value is permitted for the zone of the module in question, as denoted by X and Y, and K is incremented if necessary until a permitted value is found.

Many other schemes of allocation of OFFSET values may be devised, combining predetermination and calculation to various degrees.

The basic growth algorithm used in the embodiment described above is the algorithm disclosed in GB 1 377 859 whereby the first option is always a predetermined direction (N in the example of FIG. 4). Another possibility is to make the first option the same direction as was used to enter the module from which growth is being effected. Yet another possibility is to make the first option the next direction on from the direction used to enter the module from which growth is being effected. An example of this possibility is described in GB 2181280 (corresponding to U.S. Ser. No. 056477 filed 27 May 1987).

We claim:

1. A WSI memory comprising a plurality of memory modules formed in a chain on a wafer, each module including means responsive to clock pulses supplied thereto, logic means for linking the modules into the chain, a RAM and a free-running address counter addressing the RAM serially, means for addressing read and write commands to the memory modules individually and at least one data path chained through a series of the modules, each module being responsive to a read command addressed thereto to cause the contents of the RAM to be read out on to the or a data path as the address counter cycles through its counts in accordance with said clock pulses and each module being responsive to a write command addressed thereto to write into the RAM data supplied on the or a data path as the address counter cycles through its counts in accordance with said clock pulses.

2. A WSI memory according to claim 1, wherein there is a first data path for transmitting write data to modules and a second data path for receiving read data from modules.

3. A WSI memory according to claim 1, wherein the RAM of each module is dynamic RAM and each module incorporates its own refresh circuitry controlled by the free-running address counter.

4. A WSI memory according to claim 3, wherein the address counters have staggered count cycles so as to even out power supply demands on the power supply lines.

5. A WSI memory according to claim 4, wherein the address counters are constructed to count from different initial values on being simultaneously reset.

6. A WSI memory according to claim 4, wherein the count cycles are so staggered that no more than one or another specified small number of modules served by the same power supply conductor on the wafer refresh simultaneously.

7. A WSI memory according to claim 1, wherein each module is further adapted to respond to a counter reset command addressed thereto to reset its address counter to a datum value at an instant determined by the time of receipt of the addressed counter reset command.

8. A WSI memory according to claim 7, further comprising control means for sending counter reset commands to the modules individually to establish staggered count cycles of the address counters.

9. A WSI memory according to claim 8, wherein the control means respond to stored data to offset the count cycle of each address counter by a value predetermined for that counter.

10. A WSI memory according to claim 8, wherein the control means calculate offsets for the count cycles of the address counters in dependence upon the distance of each module down the chain, in such a manner as to minimise the delay after reading or writing to one module before being able to read or write to the next module in the chain.

11. A multi-module memory comprising an array of memory modules, each module including a RAM and an address counter for addressing the RAM, means for sending read and write commands to a selected one of said memory modules, and at least one data path passing serially through at least some of said modules, each module comprising means responsive to a read command sent thereto to cause data from said RAM to be read out serially onto said at least one data path as said address counter counts serially through addresses in the RAM and each module comprising means responsive to a write command sent thereto to write into said RAM data supplied on said at least one data path as said address counter counts serially through addresses in the RAM.

12. A multi-module memory comprising an array of memory modules, control means for said array, a write data path extending from said control means through a plurality of said modules, a read data path extending through said plurality of modules to said control means, and a clock pulse line connected from said control means to all of said modules for providing clock pulses thereto, each module including a RAM and an address counter for addressing the RAM and operated by said clock pulses to count through RAM addresses, means for sending read and write commands to a selected one of said plurality of memory modules, each module comprising means responsive to a read command sent thereto to cause data from the RAM to be read out on to said read data path as said address counter counts through a range of addresses in response to said clock pulses, and each module comprising means responsive to a write command sent thereto to write into the RAM data supplied on said write data path as the address counter counts through a range of addresses in response to said clock pulses.

* * * * *